(12) United States Patent
Tanaka et al.

(10) Patent No.: US 6,922,083 B2
(45) Date of Patent: Jul. 26, 2005

(54) HIGH SPEED SAMPLING RECEIVER WITH REDUCED OUTPUT IMPEDANCE

(75) Inventors: Kenichi Tanaka, Tokyo (JP); Kouichirou Minami, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/232,657

(22) Filed: Sep. 3, 2002

(65) Prior Publication Data
US 2003/0062939 A1 Apr. 3, 2003

(30) Foreign Application Priority Data
Sep. 4, 2001 (JP) ........................................ 2001-267001

(51) Int. Cl.[7] ............................................. G01R 15/00
(52) U.S. Cl. ........................ 327/55; 327/57; 327/217; 327/218
(58) Field of Search .......................... 327/55, 57, 199, 327/201, 202, 203, 208, 210–215, 217–219, 333, 108, 68, 81, 83; 365/189.05, 189.11, 205, 154, 156

(56) References Cited

U.S. PATENT DOCUMENTS

| | | | | |
|---|---|---|---|---|
| 4,550,326 A | | 10/1985 | Allen et al. ................... 347/44 |
| 5,311,070 A | * | 5/1994 | Dooley ........................ 327/208 |
| 5,844,428 A | * | 12/1998 | Jiang ............................ 327/57 |
| 6,107,853 A | * | 8/2000 | Nikolic et al. .............. 327/217 |
| 6,163,189 A | | 12/2000 | Ogawa ........................ 327/201 |
| 6,201,418 B1 | * | 3/2001 | Allmon ........................ 327/57 |
| 6,310,501 B1 | * | 10/2001 | Yamashita .................. 327/215 |
| 6,366,113 B1 | * | 4/2002 | Song ........................... 327/215 |
| 6,400,199 B1 | * | 6/2002 | Liu et al. .................... 327/202 |
| 6,445,210 B2 | * | 9/2002 | Nojiri ........................... 326/68 |
| 6,573,775 B2 | * | 6/2003 | Pilling ........................ 327/202 |

FOREIGN PATENT DOCUMENTS

KR    2001-0002870    1/2001

* cited by examiner

*Primary Examiner*—Long Nguyen
(74) *Attorney, Agent, or Firm*—Young & Thompson

(57) ABSTRACT

A sampling receiver includes: at least one slave latch circuit; and at least one master latch circuit which further includes: at least one differential input transistor pair, and at least one bistable circuit. Output terminals of the at least one differential input transistor pair and output terminals of the at least one bistable circuit are coupled to the at least one slave latch circuit but in parallel to each other with reference to the at least one slave latch circuit for the purpose of reducing an output impedance to allow the sampling receiver to exhibit a high speed latch operation.

10 Claims, 14 Drawing Sheets

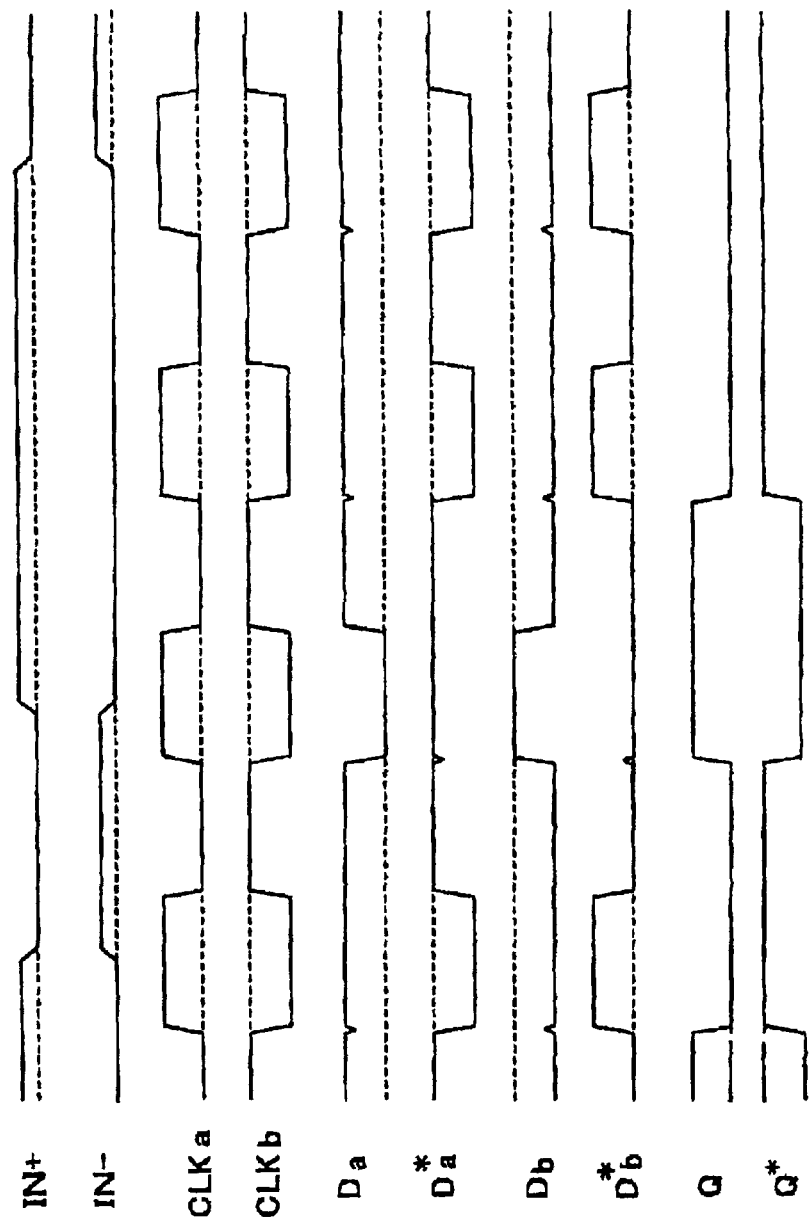

Common mode level of input signals (Vcm)

US 6,922,083 B2

HIGH SPEED SAMPLING RECEIVER WITH REDUCED OUTPUT IMPEDANCE

BACKGROUND OF THE INVENTION

1. Field of the Invention

The present invention relates to a sampling receiver, and more particularly to a high speed sampling receiver for sampling data with a small amplitude and latching the same to convert a voltage level of the latched data into an adjusted voltage level to a CMOS circuit.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

Data which have been read out from semiconductor memory devices such as DRAM may have a relatively small amplitude, while data to be inputted into the CMOS circuit should have a relatively high amplitude or a high voltage level. A sampling receiver has been used for sampling the small amplitude data from the semiconductor memory device and latching the same to perform a voltage level conversion to a high voltage level adjusted to the CMOS circuit. In one typical example, the conventional sampling receiver includes a master latch circuit and a slave latch circuit. The master latch circuit further includes a differential input transistor pair for receiving an input of data with a small amplitude, and a latch circuit for latching an output from the differential input transistor pair. The slave latch circuit latches an output from the master latch circuit and outputs a latch signal with an adjusted voltage level to the CMOS circuit.

FIG. 1 is a circuit diagram illustrative of a circuit configuration of one typical conventional sampling receiver. The sampling receiver has the following circuit configuration. A differential input transistor pair comprises two n-channel MOS field effect transistors 41 and 42 having respective gate electrodes which are connected to input terminals 31 and 32 respectively. The input terminal 31 receives an input of small amplitude data IN+, while the input terminal 32 receives another input of small amplitude data IN−. Respective source electrodes of the n-channel MOS field effect transistors 41 and 42 are commonly connected through a current supplying n-channel MOS field effect transistor 40 to a ground line 37. A gate electrode of the n-channel MOS field effect transistor 40 is connected to another input terminal 33 which receives an input of a clock signal CLK. Respective drain electrodes of the n-channel MOS field effect transistors 41 and 42 are connected to source electrodes of n-channel MOS field effect transistors 43 and 44, respectively.

A first CMOS inverter comprises the n-channel MOS field effect transistor 43 and a p-channel MOS field effect transistor 45. A second CMOS inverter comprises the n-channel MOS field effect transistor 44 and a p-channel MOS field effect transistor 46. The first and second CMOS inverters are cross-connected to each other to form a bistable circuit. Namely, an input side of the first CMOS inverter is connected to an output side of the second CMOS inverter, while an output side of the first CMOS inverter is connected to an input side of the second CMOS inverter. Further, source and drain electrodes of the p-channel MOS field effect transistor 45 are respectively connected to source and drain electrodes of a p-channel MOS field effect transistor 47. Source and drain electrodes of the p-channel MOS field effect transistor 46 are respectively connected to source and drain electrodes of a p-channel MOS field effect transistor 48. Gate electrodes of the p-channel MOS field effect transistors 47 and 48 are commonly connected to the input terminal 33 receiving the input of the clock signal "CLK". The p-channel MOS field effect transistors 47 and 48 are provided for controlling operations of the bistable circuit. Namely, the signal latch operation of the bistable circuit is controlled by the clock signal "CLK". Respective source electrodes of the p-channel MOS field effect transistors 45, 46, 47 and 48 are commonly connected to a power voltage line 36. Further, an n-channel MOS field effect transistor 49 is connected between the respective drain electrodes of the n-channel MOS field effect transistors 41 and 42. A gate electrode of the n-channel MOS field effect transistor 49 is connected to the power voltage line 36.

The master latch circuit in the sampling receiver comprises the n-channel MOS field effect transistors 40, 41, 42, 43, 44 and 49 and the p-channel MOS field effect transistors 45, 46, 47 and 48. The master latch circuit has two outputs (D, D*). The slave latch circuit in the sampling receiver further comprises a set-reset-flip-flop circuit 50 which has two input terminals "S" and "R" and two output terminals 34 "Q" and 35 "Q*". The input terminal "S" of the slave latch circuit receives the output "D" from the master latch circuit. The input terminal "R" of the slave latch circuit receives the output "D*" from the master latch circuit.

The p-channel MOS field effect transistor 47 is connected in parallel to the p-channel MOS field effect transistor 45, and the p-channel MOS field effect transistor 48 is connected in parallel to the p-channel MOS field effect transistor 46. Upon release of the latch, the p-channel MOS field effect transistors 47 and 48 turn ON, whereby the two outputs (D, D*) of the master latch circuit become high level "H".

The gate electrode of the n-channel MOS field effect transistor 49 is connected to the power voltage line 36 for allowing the power voltage VDD always applied to the gate electrode, so that the n-channel MOS field effect transistor 49 always remains in the ON-state, to provide a resistance between the respective source electrodes of the n-channel MOS field effect transistors 43 and 44. After the master latch circuit releases the signals from the latch state, then the voltage levels of the respective source electrodes of the n-channel MOS field effect transistors 43 and 44 becomes equal to each other for preparation for a next latch operation upon receipt of a next input signal.

FIG. 2 is a timing chart explaining operations of the conventional sampling receiver of FIG. 1. When the clock signal "CLK" of the low level "L" is inputted into the input terminal 33, the n-channel MOS field effect transistor 40 turns OFF, while the p-channel MOS field effect transistors 47 and 48 turn ON. The differential input transistor pair receives no current supply from the ground line 37 through the OFF-state n-channel MOS field effect transistor 40, whereby the differential input transistor pair is placed into the inoperable state. Since the p-channel MOS field effect transistors 47 and 48 are placed in the ON-state, the two outputs (D, D*) of the master latch circuit are in the high level "H". Accordingly, the set-reset-flip-flop circuit 50 as the slave latch circuit shows no change of the outputs (Q, Q*).

In the above-described state, if the clock signal "CLK" inputted into the input terminal 33 shows a level-transition from the low level "L" into the high level "H", then the n-channel MOS field effect transistor 40 turns ON, while the p-channel MOS field effect transistors 47 and 48 turn OFF, whereby the differential input transistor pair and the bistable circuit of the master latch circuit are placed in the operable state, so that the master latch circuit shows the sampling operations for sampling the input signals. At this time, the small amplitude data (IN+) of the high level and the small amplitude data (IN−) of the low level are respectively inputted into the two input terminals 31 and 32 of the differential input transistor pair, whereby the n-channel MOS field effect transistor 41 shows a current increase and a drain voltage drop, while the n-channel MOS field effect transistor 42 shows a current decrease and a drain voltage rise.

The n-channel MOS field effect transistor 43 connected in series to the n-channel MOS field effect transistor 41 shows a transition to the ON-state, while the n-channel MOS field effect transistor 44 connected in series to the n-channel MOS field effect transistor 42 shows a transition to the OFF-state. The bistable circuit, which comprises the n-channel MOS field effect transistors 43 and 44 and the p-channel MOS field effect transistors 45 and 46, shows a positive feed-back operation which causes that the n-channel MOS field effect transistor 43 and the p-channel MOS field effect transistor 46 turn ON, while the n-channel MOS field effect transistor 44 and the p-channel MOS field effect transistor 45 turn OFF. The output (D) of the master latch circuit remains in the high level "H", while the output (D*) of the master latch circuit becomes low level "L". This voltage fall of the output (D*) resets the set-reset-flip-flop circuit 50. Accordingly, the output "Q" from the set-reset-flip-flop circuit 50 is latched at the low level "L", while the output "Q*" is latched at the high level "H".

Thereafter, when the transition into the low level "L" of the clock signal "CLK" appears, then the n-channel MOS field effect transistor 40 turns OFF, while the p-channel MOS field effect transistors 47 and 48 turn ON. The differential input transistor pair receives no current supply from the ground line 37 through the OFF-state n-channel MOS field effect transistor 40, whereby the differential input transistor pair is placed into the inoperable state. Since the p-channel MOS field effect transistors 47 and 48 are placed in the ON-state, the two outputs (D, D*) of the master latch circuit are placed in the high level "H". Accordingly, the set-reset-flip-flop circuit 50 as the slave latch circuit shows no change of the outputs (Q, Q*) or holds the latched low level "L" of the output "Q" and the latched high level "H" of the output "Q*".

If the clock signal "CLK" inputted into the input terminal 33 shows the level-transition from the low level "L" into the high level "H", then the n-channel MOS field effect transistor 40 turns ON, while the p-channel MOS field effect transistors 47 and 48 turn OFF, whereby the differential input transistor pair and the bistable circuit of the master latch circuit are placed in the operable state, so that the master latch circuit shows the sampling operations for sampling the input signals. At this time, the small amplitude data (IN+) of the low level and the small amplitude data (IN−) of the high level are respectively inputted into the two input terminals 31 and 32 of the differential input transistor pair, whereby the n-channel MOS field effect transistor 42 shows a current increase and a drain voltage drop, while the n-channel MOS field effect transistor 41 shows a current decrease and a drain voltage rise.

The n-channel MOS field effect transistor 44 connected in series to the n-channel MOS field effect transistor 43 shows a transition to the ON-state, while the n-channel MOS field effect transistor 43 connected in series to the n-channel MOS field effect transistor 41 shows a transition to the OFF-state. The p-channel MOS field effect transistor 45 turns ON, while the n-channel MOS field effect transistor 46 turns OFF. The output (D*) of the master latch circuit remains in the high level "H", while the output (D*) of the master latch circuit becomes low level "L". This voltage fall of the output (D*) sets the set-reset-flip-flop circuit 50. Accordingly, the output "Q*" from the set-reset-flip-flop circuit 50 is latched at the high level "H", while the output "Q" is latched at the low level "L".

Thereafter, when the transition into the low level "L" of the clock signal "CLK" appears, then the n-channel MOS field effect transistor 40 turns OFF, while the p-channel MOS field effect transistors 47 and 48 turn ON. The differential input transistor pair and the bistable circuit are placed into the inoperable state. The two outputs (D, D*) of the master latch circuit are placed in the high level "H". Accordingly, the set-reset-flip-flop circuit 50 as the slave latch circuit shows no change of the outputs (Q, Q*) or holds the latched low level "L" of the output "Q" and the latched high level "H" of the output "Q*".

The present voltage levels of the small amplitude data (IN+, IN−) are converted to the CMOS levels and latched at those levels even when the transition into the high level "H" of the clock signal "CLK" appears.

As described above, the conventional sampling receiver includes the master latch circuit and the slave latch circuit. The master latch circuit includes the bistable circuit. The bistable circuit comprises the two CMOS inverters, wherein one comprises the n-channel MOS field effect transistor 43 and the p-channel MOS field effect transistor 45, and another comprises the n-channel MOS field effect transistor 44 and the p-channel MOS field effect transistor 46. The two CMOS inverters are connected in series to the differential input transistor pair and the current supplying transistor. If the CMOS inverters are connected directly between the power voltage line and the ground line, a significant transitional through-current appears in the data sampling process. The above series connection may, however, reduce the transitional through-current in the data sampling process, thereby reducing an unnecessary power consumption.

In the above-described conventional circuit configuration, the n-channel MOS field effect transistor 43 included in the CMOS inverter included in the master latch circuit is connected in series to the n-channel MOS field effect transistor 41 included in the differential input transistor pair. Also, the n-channel MOS field effect transistor 44 included in the CMOS inverter included in the master latch circuit is connected in series to the n-channel MOS field effect transistor 42 included in the differential input transistor pair. The externally inputted small amplitude data (IN+, IN−) are sampled upon the high level "H" of the clock signal "CLK", and then level-converted to the CMOS level by the master latch circuit for supplying output signals (D and D*) to the slave latch circuit 50. An output impedance of the output terminal 34 or 35, on which the falling output signal (D or D*) appears, is given by the sum of source-drain impedances of either a three-stage-series-connection of the n-channel MOS field effect transistors 40, 42 and 44 or another three-stage-series-connection of the n-channel MOS field effect transistors 40, 41 and 43. This means that the output impedance of the falling output signal (D or D*) is thus relatively large.

The relatively large output impedance of the falling output signal (D or D*) causes a relatively large time constant of the falling output signal from the master latch circuit. The relatively large time constant of the falling output signal makes the transistor driving ability small apparently. Namely, the relatively large time constant of the falling output signal increases a delay time in falling of the output signal from the master latch circuit. The increase in the delay time of falling of the output signal from the master latch circuit causes an increase in delay time of latch-operation of the slave latch circuit which comprises the set-reset-flip-flop circuit 50.

In the meantime, recently, the clock signal frequency for the sampling process is often high in accordance with the requirement for high speed signal processings. This makes it necessary to improve the high speed performance in the signal latch operation of the sampling receiver circuit.

In the above circumstances, the clock signal frequency is high, while the delay time of latch-operation of the slave latch circuit is large, for which reason, it is possible, in case, that the delay time in falling of the output signal from the master latch circuit is so large that the clock signal has already been inverted, even the time-delayed latch operation of the slave latch circuit has not yet been completed. In this case, an erroneous latch output signal may appear because the normal latch operation is no longer ensured.

In the above circumstances, the development of a novel high speed sampling receiver free from the above problems is desirable.

SUMMARY OF THE INVENTION

Accordingly, it is an object of the present invention to provide a novel high speed sampling receiver free from the above problems.

It is a further object of the present invention to provide a novel high speed sampling receiver capable of reducing a delay time in falling an output signal from a master latch circuit.

It is a still further object of the present invention to provide a novel high speed sampling receiver exhibiting a desired high speed latch operation with a reduced delay time.

It is yet a further object of the present invention to provide a novel high speed sampling receiver with a reduced power consumption.

It is still more object of the present invention to provide a novel high speed sampling receiver exhibiting a high speed latch operation and allowing an enlarged common mode level of input signals.

It is another object of the present invention to provide a novel master latch circuit allowing a high speed sampling receiver to be free from the above problems.

It is further another object of the present invention to provide a novel master latch circuit allowing a high speed sampling receiver to reduce a delay time in falling an output signal from a master latch circuit.

It is still further another object of the present invention to provide a novel master latch circuit allowing a high speed sampling receiver to exhibit a desired high speed latch operation with a reduced delay time.

It is yet further another object of the present invention to provide a novel master latch circuit allowing a high speed sampling receiver to have a reduced power consumption.

It is still more another object of the present invention to provide a novel master latch circuit allowing a high speed sampling receiver to exhibit a high speed latch operation and allowing an enlarged common mode level of input signals.

The present invention provides a sampling receiver including: at least one slave latch circuit; and at least one master latch circuit for performing a voltage level conversion of input signals and supplying level-converted master latch signals to the at least one slave latch circuit. The at least one master latch circuit further includes: at least one differential input transistor pair for receiving an input of the input signals and for outputting differential output signals, and at least one bistable circuit for receiving the differential output signals from the at least one differential input transistor pair and for performing a voltage level conversion of the differential output signals and for outputting level-converted master latch signals. Output terminals of the at least one differential input transistor pair and output terminals of the at least one bistable circuit are coupled to the at least one slave latch circuit but in parallel to each other with reference to the at least one slave latch circuit for the purpose of reducing an output impedance to allow the sampling receiver to exhibit a high speed latch operation.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 9 is a timing chart explaining operations of the novel sampling receiver of FIG. 8.

DETAILED DESCRIPTION OF THE PREFERRED EMBODIMENTS

Figure 1:
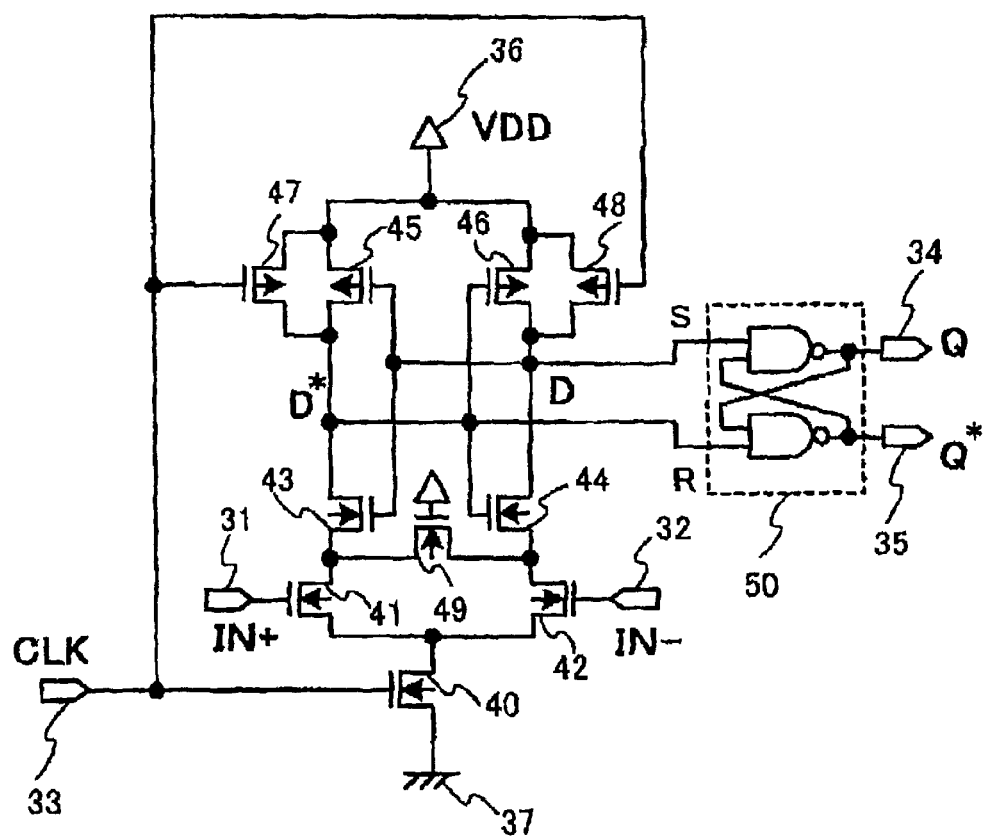
FIG. 1 is a circuit diagram illustrative of a circuit configuration of one typical conventional sampling receiver.
Figure 2:
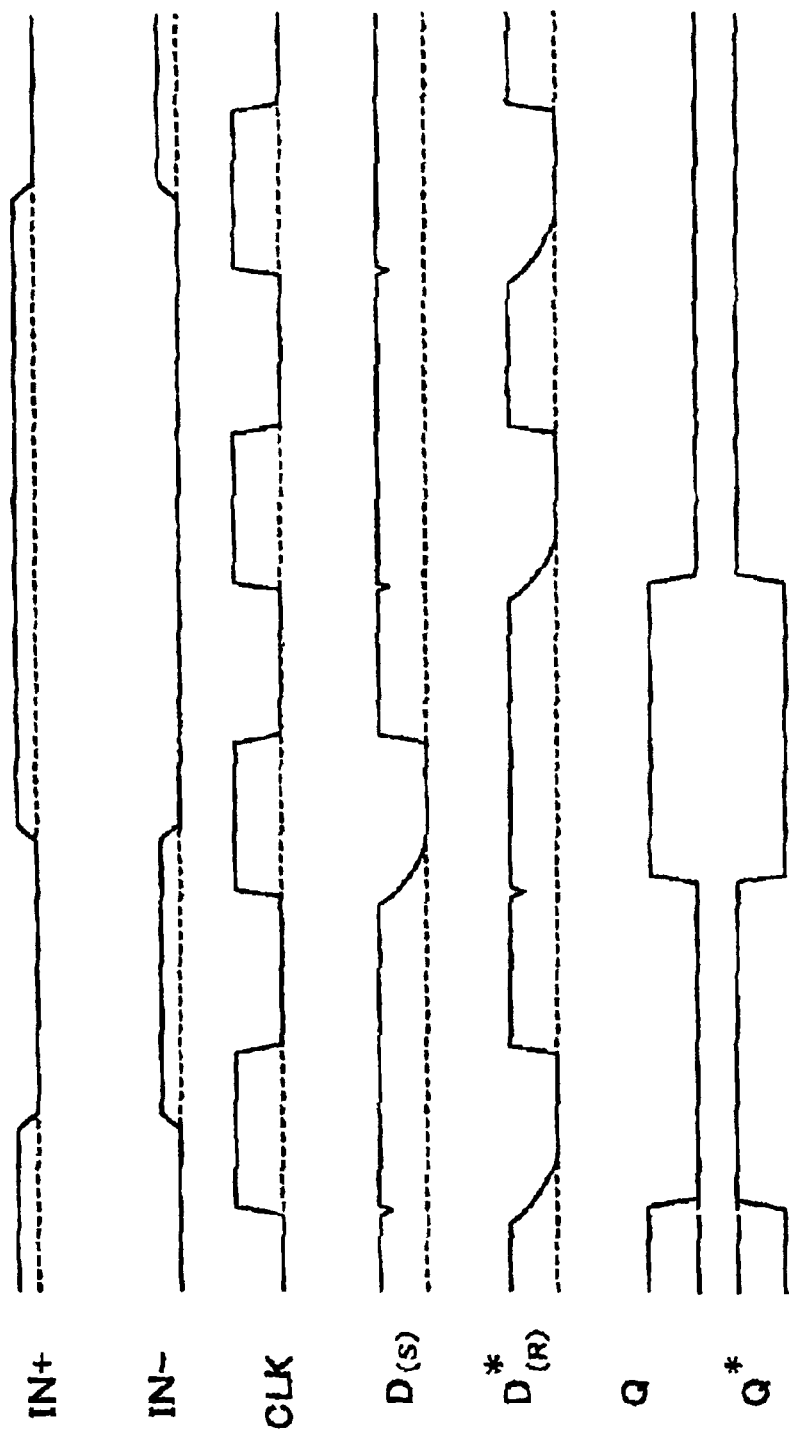
FIG. 2 is a timing chart explaining operations of the conventional sampling receiver of FIG. 1.

A first primary aspect of the present invention is a sampling receiver including: at least one slave latch circuit; and at least one master latch circuit for performing a voltage level conversion of input signals and supplying level-converted master latch signals to the at least one slave latch circuit. The at least one master latch circuit further includes at least one differential input transistor pair for receiving an input of the input signals and for outputting differential output signals, and at least one bistable circuit for receiving the differential output signals from the at least one differential input transistor pair and for performing a voltage level conversion of the differential output signals and for outputting level-converted master latch signals. Output terminals of the at least one differential input transistor pair and output terminals of the at least one bistable circuit are coupled to the at least one slave latch circuit but in parallel to each other with reference to the at least one slave latch circuit for the purpose of reducing an output impedance to allow the sampling receiver to exhibit a high speed latch operation.

In one typical embodiment, the sampling receiver may include a first master latch circuit which further includes: a first differential input transistor pair comprising a first pair of first conductivity type channel field effect transistors; and a single bistable circuit comprising a pair of first and second CMOS inverters. Output terminals of the first differential input transistor pair, and output terminals of the first and second CMOS inverters are coupled to the at least one slave latch circuit but in parallel to each other with reference to the at least one slave latch circuit for the purpose of reducing an output impedance to allow the sampling receiver to exhibit a high speed latch operation.

In another typical embodiment, the sampling receiver may include a first master latch circuit which further includes: a first differential input transistor pair comprising a first pair of first conductivity type channel field effect transistors; a second differential input transistor pair comprising a second pair of second conductivity type channel field effect transistors; and a single bistable circuit comprising a pair of first and second CMOS inverters. Output terminals of the first differential input transistor pair, output terminals of the second differential input transistor pair, and output terminals of the first and second CMOS inverters are coupled to the at least one slave latch circuit but in parallel to each other with reference to the at least one slave latch circuit for the purpose of reducing an output impedance to allow the sampling receiver to exhibit a high speed latch operation. In this case, the first and second differential input transistor pairs may be controlled by first and second clock signals, respectively, and the first and second clock signals take different states which are inverted to each other. In this case, the first differential input transistor pair may receive a first current supply indirectly from a first current supplying line through a first current-supplying first conductivity type channel field effect transistor which is controlled by the first clock signal, and the second differential input transistor pair may receive a second current supply indirectly from a second current supplying line through a second current-supplying second conductivity type channel field effect transistor which is controlled by the second clock signal. Alternatively, the first differential input transistor pair may receive a first current supply indirectly from a first current supplying line through a first current-supplying first conductivity type channel field effect transistor which is controlled by the first clock signal, and the second differential input transistor pair may receive a second current supply directly from a second current supplying line.

In still another typical embodiment, the sampling receiver may include first and second master latch circuits coupled to the at least one slave latch circuit but in parallel to each other with reference to the at least one slave latch circuit. The first master latch circuit may further include: a first differential input transistor pair comprising a first pair of first conductivity type channel field effect transistors; and a first bistable circuit comprising a pair of first and second CMOS inverters. The second master latch circuit may further include: a second differential input transistor pair comprising a second pair of second conductivity type channel field effect transistors; and a second bistable circuit comprising a pair of third and fourth CMOS inverters. Output terminals of the first and second differential input transistor pairs, and output terminals of the first, second, third and fourth CMOS inverters are coupled to the at least one slave latch circuit but in parallel to each other with reference to the at least one slave latch circuit for the purpose of reducing an output impedance to allow the sampling receiver to exhibit a high speed latch operation. In this case, the sampling receiver may further include: first and second cross-coupled inverters. The first cross-coupled inverter may further comprise a first pair of first and second inverters coupled between an output terminal of the first CMOS inverter of the first master latch circuit and an output terminal of the third CMOS inverter of the second master latch circuit. The second cross-coupled inverter may further comprise a second pair of third and fourth inverters coupled between an output terminal of the second CMOS inverter of the first master latch circuit and an output terminal of the fourth CMOS inverter of the second master latch circuit. In this case, the at least one slave latch circuit may comprise a differential type set/reset flip-flop circuit which further includes: the following four input terminals. The first input terminal is a set terminal coupled to the output terminal of the first CMOS inverter of the first master latch circuit. The second input terminal is a reset terminal coupled to the output terminal of the second CMOS inverter of the first master latch circuit. The third input terminal is an inversion set terminal coupled to the output terminal of the third CMOS inverter of the second master latch circuit. The fourth input terminal is an inversion reset terminal coupled to the output terminal of the fourth CMOS inverter of the second master latch circuit. In this case, also the first differential input transistor pair of the first master latch circuit may receive a first current supply indirectly from a first current supplying line through a first current-supplying first conductivity type channel field effect transistor which is controlled by the first clock signal. The second differential input transistor pair of the second master latch circuit may also receive a second current supply indirectly from a second current supplying line through a second current-supplying second conductivity type channel field effect transistor which is controlled by the second clock signal. Further, the first and second differential input transistor pairs may be controlled by first and second clock signals, respectively, and the first and second clock signals take different states which are inverted to each other. At least one of the first and second master latch circuits is always placed in latch-operable state over any common mode levels of input signals.

A second primary aspect of the present invention is a latch circuit including: at least one master latch circuit for performing a voltage level conversion of input signals and outputting level-converted master latch signals from master latch circuit output terminals. The at least one master latch circuit further includes: at least one differential input transistor pair for receiving an input of the input signals and for outputting differential output signals, and at least one bistable circuit for receiving the differential output signals from the at least one differential input transistor pair and for performing a voltage level conversion of the differential output signals and for outputting level-converted master latch signals. Output terminals of the at least one differential input transistor pair and output terminals of the at least one bistable circuit are coupled to the master latch circuit output terminals but in parallel to each other with reference to the master latch circuit output terminals for the purpose of reducing an output impedance to allow the master latch circuit to exhibit a high speed latch operation.

In one typical embodiment, the latch circuit may include a first master latch circuit which further includes: a first differential input transistor pair comprising a first pair of first conductivity type channel field effect transistors; and a single bistable circuit comprising a pair of first and second CMOS inverters. Output terminals of the first differential input transistor pair, and output terminals of the first and second CMOS inverters are coupled to the master latch circuit output terminals but in parallel to each other with reference to the master latch circuit output terminals for the purpose of reducing an output impedance to allow the master latch circuit to exhibit a high speed latch operation.

In another typical embodiment, the latch circuit may include a first master latch circuit which further includes: a first differential input transistor pair comprising a first pair of first conductivity type channel field effect transistors; a second differential input transistor pair comprising a second pair of second conductivity type channel field effect transistors; and a single bistable circuit comprising a pair of first and second CMOS inverters. Output terminals of the first differential input transistor pair, output terminals of the second differential input transistor pair, and output terminals of the first and second CMOS inverters are coupled to the master latch circuit output terminals but in parallel to each other with reference to the master latch circuit output terminals for the purpose of reducing an output impedance to allow the master latch circuit to exhibit a high speed latch operation. In this case, the first and second differential input transistor pairs may be controlled by first and second clock signals, respectively, and the first and second clock signals take different states which are inverted to each other. In this case, the first differential input transistor pair may receive a first current supply indirectly from a first current supplying line through a first current-supplying first conductivity type channel field effect transistor which is controlled by the first clock signal. The second differential input transistor pair may also receive a second current supply indirectly from a second current supplying line through a second current-supplying second conductivity type channel field effect transistor which is controlled by the second clock signal.

Alternatively, the first differential input transistor pair may receive a first current supply indirectly from a first current supplying line through a first current-supplying first conductivity type channel field effect transistor which is controlled by the first clock signal. The second differential input transistor pair may receive a second current supply directly from a second current supplying line.

In still another embodiment, the latch circuit may include first and second master latch circuits coupled in parallel to each other with reference to the master latch circuit output terminals. The first master latch circuit may further include: a first differential input transistor pair comprising a first pair of first conductivity type channel field effect transistors; and a first bistable circuit comprising a pair of first and second CMOS inverters. The second master latch circuit may further include: a second differential input transistor pair comprising a second pair of second conductivity type channel field effect transistors; and a second bistable circuit comprising a pair of third and fourth CMOS inverters. Output terminals of the first and second differential input transistor pairs, and output terminals of the first, second, third and fourth CMOS inverters are coupled to the master latch circuit output terminals but in parallel to each other with reference to the master latch circuit output terminals for the purpose of reducing an output impedance to allow the master latch circuit to exhibit a high speed latch operation. In this case, the first differential input transistor pair of the first master latch circuit may receive a first current supply indirectly from a first current supplying line through a first current-supplying first conductivity type channel field effect transistor which is controlled by the first clock signal. The second differential input transistor pair of the second master latch circuit may receive a second current supply indirectly from a second current supplying line through a second current-supplying second conductivity type channel field effect transistor which is controlled by the second clock signal. In this case, also the first and second differential input transistor pairs may be controlled by first and second clock signals, respectively, and the first and second clock signals take different states which are inverted to each other. At least one of the first and second master latch circuits is always placed in latch-operable state over any common mode levels of input signals.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 3:
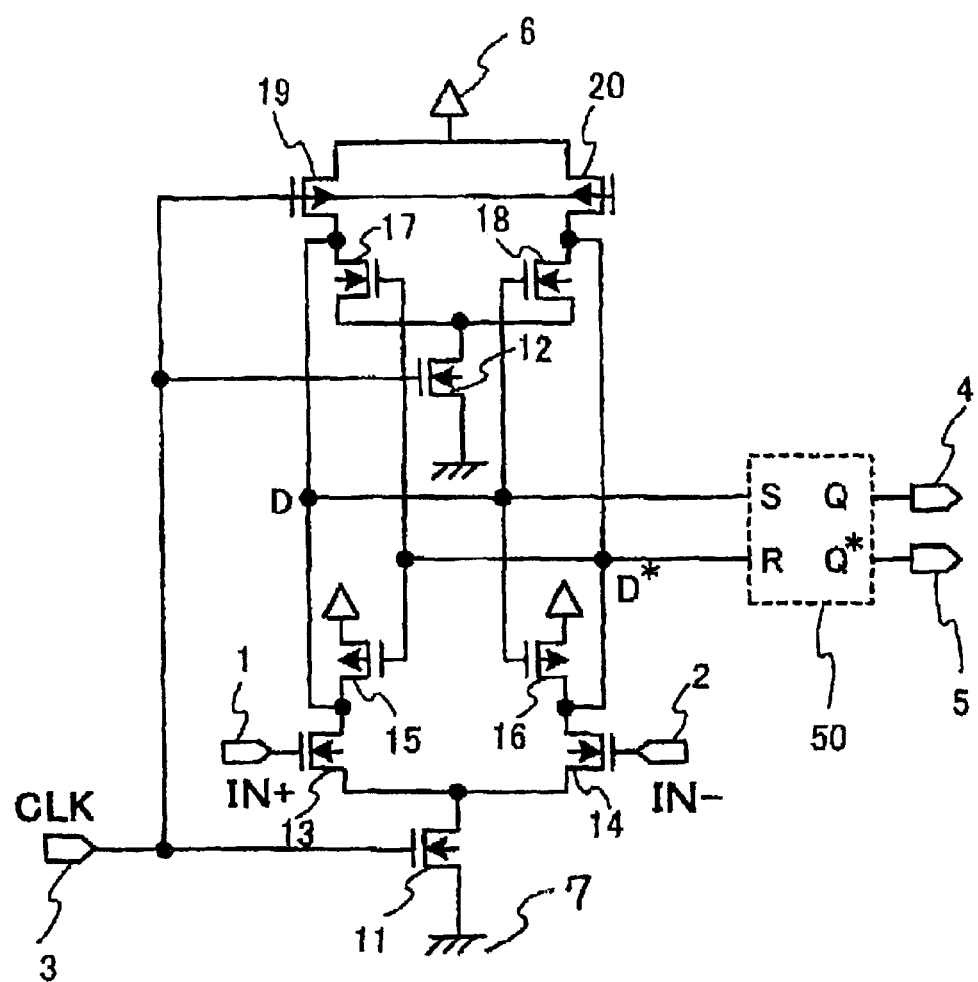
FIG. 3 is a circuit diagram illustrative of a circuit configuration of one typical novel sampling receiver in a first embodiment in accordance with the present invention.

First Embodiment:

A first embodiment according to the present invention will be described in detail with reference to the drawings. FIG. 3 is a circuit diagram illustrative of a circuit configuration of one typical novel sampling receiver in a first embodiment in accordance with the present invention. The sampling receiver has the following circuit configuration.

The sampling receiver includes a master latch circuit and a slave latch circuit. The slave latch circuit comprises a set-reset-flip-flop circuit 50 which has two input terminals "S" and "R" and two output terminals 4 "Q" and 5 "Q*". The input terminal "S" of the slave latch circuit receives the output "D" from the master latch circuit. The input terminal "R" of the slave latch circuit receives the output "D*" from the master latch circuit.

The master latch circuit includes a differential input transistor pair and a bistable circuit. The bistable circuit comprises two CMOS inverters. The differential input transistor pair further comprises two n-channel MOS field effect transistors 13 and 14 having respective gate electrodes which are connected to input terminals 1 and 2 respectively. The input terminal 1 receives an input of small amplitude data IN+, while the input terminal 2 receives another input of small amplitude data IN−. Respective source electrodes of the n-channel MOS field effect transistors 13 and 14 are commonly connected through a current supplying n-channel MOS field effect transistor 11 to a ground line 7. A gate electrode of the n-channel MOS field effect transistor 11 is connected to another input terminal 3 which receives an input of a clock signal CLK. In the sampling process, the n-channel MOS field effect transistor 11 turns ON to place the differential input transistor pair in an operable state. In the non-sampling state, the n-channel MOS field effect transistor 11 remains OFF to place the differential input transistor pair in an inoperable state. A drain electrode of the n-channel MOS field effect transistor 13 is connected to drain electrodes of p-channel and n-channel MOS field effect transistors 15 and 17 as well as connected to a drain electrode of a p-channel MOS field effect transistor 19. A drain electrode of the n-channel MOS field effect transistor 14 is connected to drain electrodes of p-channel and n-channel MOS field effect transistors 16 and 18 as well as connected to a drain electrode of a p-channel MOS field effect transistor 20.

As described above, the bistable circuit comprises first and second CMOS inverters. The first CMOS inverter comprises the p-channel MOS field effect transistor 15 and the n-channel MOS field effect transistor 17. The second CMOS inverter comprises the p-channel MOS field effect transistor 16 and the n-channel MOS field effect transistor 18. The first and second CMOS inverters are cross-connected to each other to form the bistable circuit. Namely, an input side of the first CMOS inverter is connected to an output side of the second CMOS inverter, while an output side of the first CMOS inverter is connected to an input side of the second CMOS inverter. Source electrodes of the p-channel MOS field effect transistors 15 and 16 are connected to a power voltage line 6. Source electrodes of the n-channel MOS field effect transistors 17 and 18 are commonly connected through an n-channel MOS field effect transistor 12 to a ground line 7. A gate electrode of the n-channel MOS field effect transistor 12 is connected to the input terminal 3 for receiving the clock signal "CLK". The drain electrode of the p-channel MOS field effect transistor 19 is connected to the output side of the first CMOS inverter and also the drain electrode of the n-channel MOS field effect transistor 13 in the differential input transistor pair. A source electrode of the p-channel MOS field effect transistor 19 is connected to the power voltage line. The drain electrode of the p-channel MOS field effect transistor 20 is connected to the output side of the second CMOS inverter and also the drain electrode of the n-channel MOS field effect transistor 14 in the differential input transistor pair. A source electrode of the p-channel MOS field effect transistor 20 is connected to the power voltage line.

The master latch circuit in the sampling receiver comprises the n-channel MOS field effect transistors 11, 12, 13, 14, 17 and 18, and the p-channel MOS field effect transistors 15, 16, 19 and 20. The master latch circuit has two outputs (D, D*) from the first and second CMOS inverters, respectively. The master latch circuit includes the differential input transistor pair which comprises the n-channel MOS field effect transistors 13 and 14. The master latch circuit includes the bistable circuit which further includes a pair of the first and second CMOS inverters. The first CMOS inverter comprises the first pair of the p-channel and n-channel MOS field effect transistors 15 and 17. The second CMOS inverter comprises the second pair of the p-channel and n-channel MOS field effect transistors 16 and 18.

The p-channel MOS field effect transistors 15 and 19 are connected in parallel to each other between the power voltage line and the drain electrode of the n-channel MOS field effect transistor 13. The gate electrode of the p-channel MOS field effect transistor 19 receives the clock signal "CLK". Also, the p-channel MOS field effect transistors 16 and 20 are connected in parallel to each other between the power voltage line and the drain electrode of the n-channel MOS field effect transistor 14. The gate electrode of the p-channel MOS field effect transistor 20 receives the clock signal "CLK". In the release from the latch-state of the master latch circuit, the p-channel MOS field effect transistors 19 and 20 turn ON, so that both the outputs (D, D*) of the master latch circuit become the high level "H". In the latch-state of the master latch circuit, the n-channel MOS field effect transistor 12 turns ON, so as to supply a current to the bistable circuit and also to suppress any substantive through-current in the transitional process of the first and second CMOS inverters.

Figure 4:
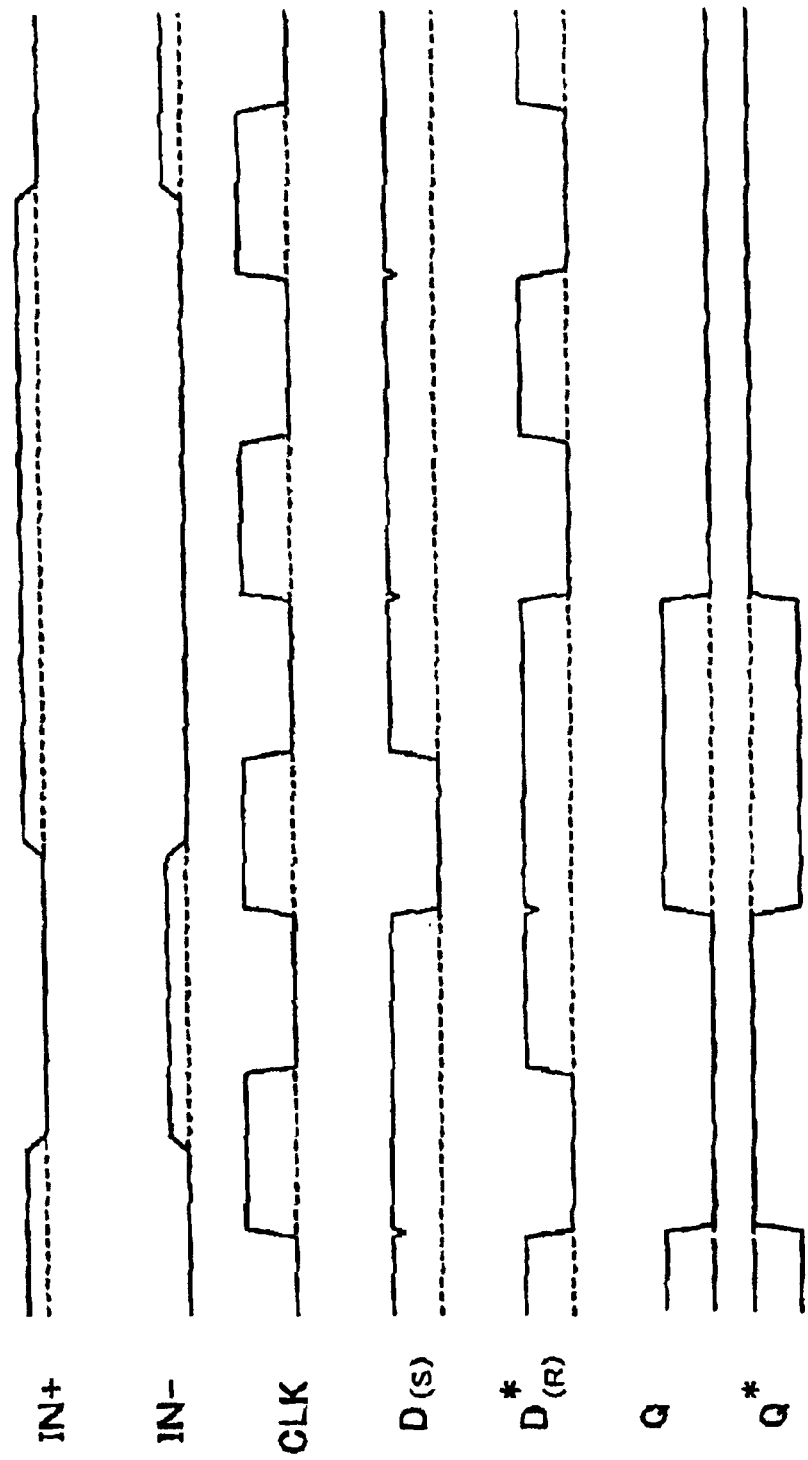
FIG. 4 is a timing chart explaining operations of the novel sampling receiver of FIG. 3.

FIG. 4 is a timing chart explaining operations of the novel sampling receiver of FIG. 3. When the clock signal "CLK" of the low level "L" is inputted into the input terminal 3, the n-channel MOS field effect transistors 11 and 12 turn OFF, while the p-channel MOS field effect transistors 19 and 20 turn ON. The differential input transistor pair receives no current supply from the ground line 7 through the OFF-state n-channel MOS field effect transistor 11, whereby the differential input transistor pair is placed into the inoperable state. The bistable circuit also receives no current supply from the ground line 7 through the OFF-state n-channel MOS field effect transistor 12, whereby the bistable circuit is placed into the inoperable state. Since the p-channel MOS field effect transistors 19 and 20 are placed in the ON-state, the two outputs (D, D*) from the master latch circuit are in the high level "H". Accordingly, the set-reset-flip-flop circuit 50 as the slave latch circuit shows no change of the outputs (Q, Q*) appearing on the first and second output terminals 4 and 5.

In the above-described state, if the clock signal "CLK" inputted into the input terminal 3 shows a level-transition from the low level "L" into the high level "H", then the n-channel MOS field effect transistors 11 and 12 turn ON, while the p-channel MOS field effect transistors 19 and 20 turn OFF, whereby the differential input transistor pair and the bistable circuit of the master latch circuit are placed in the operable state, so that the master latch circuit shows the sampling operations for sampling the input signals. At this time, the small amplitude data (IN+) of the high level and the small amplitude data (IN−) of the low level are respectively inputted into the two input terminals 1 and 2 of the differential input transistor pair, whereby the n-channel MOS field effect transistor 13 shows a current increase and a drain voltage drop, while the n-channel MOS field effect transistor 14 shows a current decrease and a drain voltage rise.

The n-channel MOS field effect transistor 18 with the gate electrode connected to the drain electrode of the n-channel MOS field effect transistor 13 shows a transition to the OFF-state, while the p-channel MOS field effect transistor 16 with the gate electrode connected to the drain electrode of the n-channel MOS field effect transistor 13 shows another transition to the ON-state. The n-channel MOS field effect transistor 17 with the gate electrode connected to the drain electrode of the n-channel MOS field effect transistor 14 shows a transition to the ON-state, while the p-channel MOS field effect transistor 15 with the gate electrode connected to the drain electrode of the n-channel MOS field effect transistor 14 shows another transition to the OFF-state. The output (D*) of the master latch circuit remains in the high level "H", while the output (D*) of the master latch circuit becomes low level "L". This voltage fall of the output (D*) resets the set-reset-flip-flop circuit 50. Accordingly, the output "Q" from the set-reset-flip-flop circuit 50 is latched at the low level "L", while the output "Q*" is latched at the high level "H".

Thereafter, when the transition into the low level "L" of the clock signal "CLK" appears, then the n-channel MOS field effect transistors 11 and 12 turn OFF, while the p-channel MOS field effect transistors 19 and 20 turn ON. The differential input transistor pair receives no current supply from the ground line 7 through the OFF-state n-channel MOS field effect transistor 11, whereby the differential input transistor pair is placed into the inoperable state. The bistable circuit also receives no current supply from the ground line 7 through the OFF-state n-channel MOS field effect transistor 12, whereby the bistable circuit is placed into the inoperable state. Since the p-channel MOS field effect transistors 19 and 20 are placed in the ON-state, the two outputs (D, D*) of the master latch circuit are placed in the high level "H". Accordingly, the set-reset-flip-flop circuit 50 as the slave latch circuit shows no change of the outputs (Q, Q*) or holds the latched low level "L" of the output "Q" and the latched high level "H" of the output "Q*".

If the clock signal "CLK" inputted into the input terminal 33 shows the level-transition from the low level "L" into the high level "H", then the n-channel MOS field effect transistors 11 and 12 turn ON, while the p-channel MOS field effect transistors 19 and 20 turn OFF, whereby the differential input transistor pair and the bistable circuit of the master latch circuit are placed in the operable state, so that the master latch circuit shows the sampling operations for sampling the input signals. At this time, the small amplitude data (IN+) of the low level and the small amplitude data (IN−) of the high level are respectively inputted into the two input terminals 1 and 2 of the differential input transistor pair, whereby the n-channel MOS field effect transistor 14 shows a current increase and a drain voltage drop, while the n-channel MOS field effect transistor 13 shows a current decrease and a drain voltage rise.

The n-channel MOS field effect transistor 18 with the gate electrode connected to the drain electrode of the n-channel MOS field effect transistor 13 shows a transition to the ON-state, while the p-channel MOS field effect transistor 16 with the gate electrode connected to the drain electrode of the n-channel MOS field effect transistor 13 shows another transition to the OFF-state. The n-channel MOS field effect transistor 17 with the gate electrode connected to the drain electrode of the n-channel MOS field effect transistor 14 shows a transition to the OFF-state, while the p-channel MOS field effect transistor 15 with the gate electrode connected to the drain electrode of the n-channel MOS field effect transistor 14 shows another transition to the ON-state. The output (D) of the master latch circuit becomes low level "L", while the output (D*) of the master latch circuit remains in the high level "H". This voltage fall of the output (D*) sets the set-reset-flip-flop circuit 50. Accordingly, the output "Q" from the set-reset-flip-flop circuit 50 is latched at the high level "H", while the output "Q*" is latched at the low level "L".

Thereafter, when the transition into the low level "L" of the clock signal "CLK" appears, then the n-channel MOS field effect transistors 11 and 12 turn OFF, while the p-channel MOS field effect transistors 19 and 20 turn ON. The differential input transistor pair and the bistable circuit are placed into the inoperable state. The two outputs (D, D*) of the master latch circuit are placed in the high level "H". Accordingly, the set-reset-flip-flop circuit 50 as the slave latch circuit shows no change of the outputs (Q, Q*) or holds the latched high level "H" of the output "Q" and the latched low level "L" of the output "Q*".

The present voltage levels of the small amplitude data (IN+, IN−) are converted to the CMOS levels and latched at those levels even when the transition into the high level "H" of the clock signal "CLK" appears.

As described above, the drain electrode of the n-channel MOS field effect transistor 13 included in the differential input transistor pair is connected to the first output (D*) of the master latch circuit. The drain electrode of the n-channel MOS field effect transistor 17 included in the bistable circuit is also connected to the first output (D*) of the master latch circuit. Namely, the respective drain electrodes of the n-channel MOS field effect transistors 13 and 17 are in parallel to each other with reference to the first output (D*) of the master latch circuit. Similarly, the drain electrode of the n-channel MOS field effect transistor 14 included in the differential input transistor pair is connected to the second output (D*) of the master latch circuit. The drain electrode of the n-channel MOS field effect transistor 18 included in the bistable circuit is also connected to the second output (D*) of the master latch circuit. Namely, the respective drain electrodes of the n-channel MOS field effect transistors 14 and 18 are in parallel to each other with reference to the second output (D*) of the master latch circuit.

The externally inputted small amplitude data (IN+, IN−) are sampled upon the high level "H" of the clock signal "CLK", and then level-converted to the CMOS level by the master latch circuit for supplying output signals (D and D*) to the slave latch circuit 50. An output impedance of the output terminal of the master latch circuit, on which the falling output signal (D or D*) appears, is given by the sum of source-drain impedances of either a two-stage-series-connection of the n-channel MOS field effect transistors 11 and 13 or another two-stage-series-connection of the n-channel MOS field effect transistors 11 and 14. This means that the output impedance of the falling output signal (D or D*) is thus smaller than the output impedance given by the three-stage-series-connection of the above-described conventional sampling receiver shown in FIG. 1.

The relatively small output impedance of the falling output signal (D or D*) causes a relatively small time constant of the falling output signal from the master latch circuit. The relatively small time constant of the falling output signal makes the transistor driving ability large apparently. Namely, the relatively small time constant of the falling output signal reduces a delay time in falling of the output signal from the master latch circuit. The reduction in the delay time of falling of the output signal from the master latch circuit causes a reduction in delay time of latch-operation of the slave latch circuit which comprises the set-reset-flip-flop circuit 50.

According to the above novel circuit configuration of the first embodiment of the present invention, the output side of the bistable circuit is connected in parallel to the output side of the differential input transistor pair. This circuit configuration reduces the number of the series-connected-stages of the transistors to reduce the output impedance, thereby reducing the delay time in falling the output signal from the master latch circuit. This allows the sampling receiver to exhibit a desired high speed latch operation.

The above novel circuit configuration has a first series connection of the n-channel MOS field effect transistor 12 and either the n-channel MOS field effect transistor 17 or 18 included in the bistable circuit between the ground line 7 and the drain electrode of the p-channel MOS field effect transistor 19 or 20. The above novel circuit configuration has a second series connection of the n-channel MOS field effect transistor 11 and either the n-channel MOS field effect transistor 13 or 14 included in the differential input transistor pair. The first and second series connections are in parallel to each other, for which reason the output impedance is further reduced, thereby further reducing the delay time in falling the output signal from the master latch circuit. This further improves the high speed performance in the latch operation of the sampling receiver.

In the above circumstances, even if the clock signal frequency is high, while the delay time of latch-operation of the slave latch circuit is small, for which reason, it is possible, any cases, that the delay time in falling of the output signal from the master latch circuit is so small as to ensure that the clock signal is inverted but after the time-delayed latch operation of the slave latch circuit has been completed. In any cases, the sampling receiver is free of any undesired malfunction.

In addition, the current-supplying n-channel MOS field effect transistors 11 and 12 turn ON in the latch-operation so as to suppress the transitional through-current to the CMOS inverters forming the bistable circuit. This circuit configuration reduces the power consumption of the sampling receiver.

Figure 5:
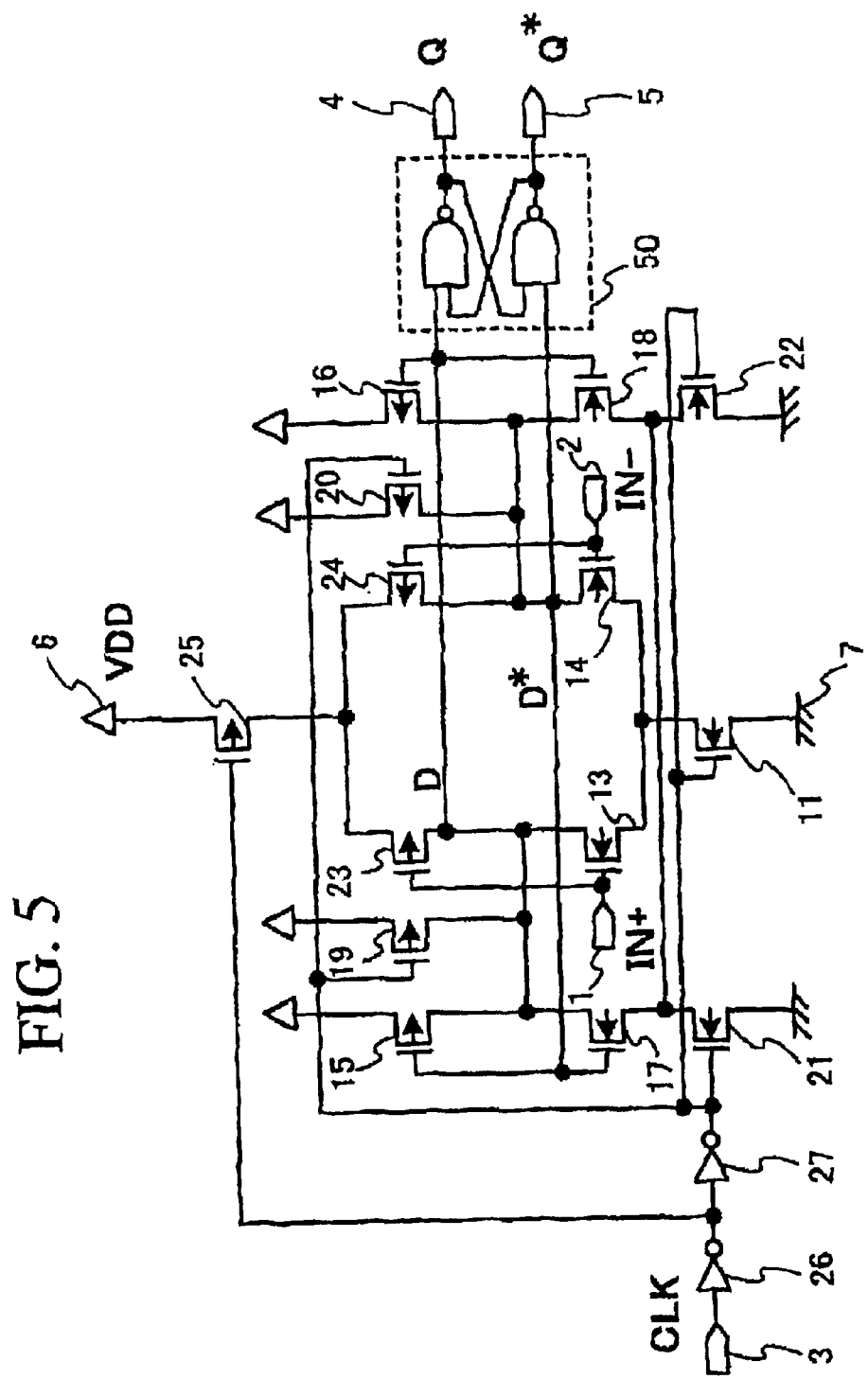
FIG. 5 is a circuit diagram illustrative of a circuit configuration of one typical novel sampling receiver in a second embodiment in accordance with the present invention.

Second Embodiment:

A second embodiment according to the present invention will be described in detail with reference to the drawings. FIG. 5 is a circuit diagram illustrative of a circuit configuration of one typical novel sampling receiver in a second embodiment in accordance with the present invention. The sampling receiver of this second embodiment has the following circuit configuration which is different from the first embodiment in including both a first differential input transistor pair of two n-channel MOS field effect transistors 13 and 14 and a second differential input transistor pair of two p-channel MOS field effect transistors 23 and 24.

The sampling receiver includes a master latch circuit and a slave latch circuit. The slave latch circuit comprises a set-reset-flip-flop circuit 50 which has two input terminals "S" and "R" and two output terminals 4 "Q" and 5 "Q*". The input terminal "S" of the slave latch circuit receives the output "D" from the master latch circuit. The input terminal "R" of the slave latch circuit receives the output "D*" from the master latch circuit.

The master latch circuit includes the first and second differential input transistor pairs and a bistable circuit. The bistable circuit comprises two CMOS inverters.

The first differential input transistor pair further comprises two n-channel MOS field effect transistors 13 and 14 having respective gate electrodes which are connected to input terminals 1 and 2 respectively. The input terminal 1 receives an input of small amplitude data IN+, while the input terminal 2 receives another input of small amplitude data IN−. Respective source electrodes of the n-channel MOS field effect transistors 13 and 14 are commonly connected through a current supplying n-channel MOS field effect transistor 11 to a ground line 7. A gate electrode of the n-channel MOS field effect transistor 11 is connected through a series connection of two inverters 26 and 27 to another input terminal 3 which receives an input of a clock signal CLK for receiving the clock signal CLK. In the sampling process, the n-channel MOS field effect transistor 11 turns ON to place the first and second differential input transistor pairs in an operable state. In the non-sampling state, the n-channel MOS field effect transistor 11 remains OFF to place the first and second differential input transistor pairs in an inoperable state. A drain electrode of the n-channel MOS field effect transistor 13 is connected to drain electrodes of p-channel and n-channel MOS field effect transistors 15 and 17 as well as connected to drain electrodes of p-channel MOS field effect transistors 19 and 23. A drain electrode of the n-channel MOS field effect transistor 14 is connected to drain electrodes of p-channel and n-channel MOS field effect transistors 16 and 18 as well as connected to drain electrodes of p-channel MOS field effect transistors 20 and 24.

The second differential input transistor pair further comprises two p-channel MOS field effect transistors 23 and 24 having respective gate electrodes which are connected to the input terminals 1 and 2 respectively. Respective source electrodes of the p-channel MOS field effect transistors 23 and 24 are commonly connected through a current supplying p-channel MOS field effect transistor 25 to a power voltage line 6. A gate electrode of the p-channel MOS field effect transistor 25 is connected through the inverter 26 only to the input terminal 3 which receives the input of the clock signal CLK for receiving the inverted clock signal/CLK. In the sampling process, the p-channel MOS field effect transistor 25 turns ON to place the first and second differential input transistor pairs in an operable state. In the non-sampling state, the n-channel MOS field effect transistor 11 remains OFF to place the first and second differential input transistor pairs in an inoperable state. A drain electrode of the p-channel MOS field effect transistor 23 is connected to the drain electrodes of p-channel and n-channel MOS field effect transistors 15 and 17 as well as connected to the drain electrodes of the n-channel and p-channel MOS field effect transistors 13 and 19. A drain electrode of the p-channel MOS field effect transistor 24 is connected to the drain electrodes of the p-channel and n-channel MOS field effect transistors 16 and 18 as well as connected to the drain electrodes of the n-channel and p-channel MOS field effect transistors 14 and 20.

As described above, the bistable circuit comprises first and second CMOS inverters. The first CMOS inverter comprises the p-channel MOS field effect transistor 15 and the n-channel MOS field effect transistor 17. The second CMOS inverter comprises the p-channel MOS field effect transistor 16 and the n-channel MOS field effect transistor 18. The first and second CMOS inverters are cross-connected to each other to form the bistable circuit. Namely, an input side of the first CMOS inverter is connected to an output side of the second CMOS inverter, while an output side of the first CMOS inverter is connected to an input side of the second CMOS inverter. Source electrodes of the p-channel MOS field effect transistors 15 and 16 are connected to the power voltage line 6. A source electrode of the n-channel MOS field effect transistor 17 is connected through an n-channel MOS field effect transistor 21 to the ground line 7. A source electrode of the n-channel MOS field effect transistor 18 is connected through an n-channel MOS field effect transistor 22 to the ground line 7. Gate electrodes of the n-channel MOS field effect transistors 21 and 22 are commonly connected through the series connection of the two inverters 26 and 27 to the input terminal 3 for receiving the clock signal "CLK". The drain electrode of the p-channel MOS field effect transistor 19 is connected to the output side of the first CMOS inverter and also the drain electrodes of the n-channel and p-channel MOS field effect transistors 13 and 23 respectively included in the first and second differential input transistor pairs. A source electrode of the p-channel MOS field effect transistor 19 is connected to the power voltage line 6. The drain electrode of the p-channel MOS field effect transistor 20 is connected to the output side of the second CMOS inverter and also the drain electrodes of the n-channel and p-channel MOS field effect transistors 14 and 24 respectively included in the first and second differential input transistor pairs. A source electrode of the p-channel MOS field effect transistor 20 is connected to the power voltage line.

The master latch circuit in the sampling receiver comprises the n-channel MOS field effect transistors 11, 13, 14, 17, 18, 21 and 22, and the p-channel MOS field effect transistors 15, 16, 19, 20, 23, 24 and 25. The master latch circuit has two outputs (D, D*) from the first and second CMOS inverters, respectively. The master latch circuit includes the first differential input transistor pair which comprises the n-channel MOS field effect transistors 13 and 14 and also the second differential input transistor pair which comprises the p-channel MOS field effect transistors 23 and 24. The master latch circuit includes the bistable circuit which further includes a pair of the first and second CMOS inverters. The first CMOS inverter comprises the first pair of the p-channel and n-channel MOS field effect transistors 15 and 17. The second CMOS inverter comprises the second pair of the p-channel and n-channel MOS field effect transistors 16 and 18.

The p-channel MOS field effect transistors 15 and 19 are connected in parallel to each other between the power voltage line 6 and the drain electrodes of the n-channel and p-channel MOS field effect transistors 13 and 23. The gate electrode of the p-channel MOS field effect transistor 19 receives the clock signal "CLK". Also, the p-channel MOS field effect transistors 16 and 20 are connected in parallel to each other between the power voltage line and the drain electrodes of the n-channel and p-channel MOS field effect transistors 14 and 24. The gate electrode of the p-channel MOS field effect transistor 20 receives the clock signal "CLK". In the release from the latch-state of the master latch circuit, the p-channel MOS field effect transistors 19 and 20 turn ON, so that both the outputs (D, D*) of the master latch circuit become the high level "H". In the latch-state of the master latch circuit, the n-channel MOS field effect transistors 21 and 22 turn ON, so as to supply a current to the bistable circuit and also to suppress any substantive through-current in the transitional process of the first and second CMOS inverters.

The first and second differential input transistor pairs are connected in parallel to each other with reference to the output side of the master latch circuit.

In the above-described circuit configuration, the three current-supplying n-channel MOS field effect transistors 11, 21 and 22 and the single current-supplying p-channel MOS field effect transistor 25 are provided. It is, however, possible as a modification that in place of the two current-supplying n-channel MOS field effect transistors 21 and 22, a single current-supplying n-channel MOS field effect transistor may be provided.

The signal latch operation of the sampling receiver shown in FIG. 5 in accordance with this second embodiment is the same as of the sampling receiver in the first embodiment and as shown in FIG. 4. The duplicate detailed descriptions will be omitted.

The reason why not only the first differential input transistor pair but also the second differential input transistor pair are provided in this second embodiment would be as follows.

As described above, the differential input n-channel transistor pair is designed to detect the difference in voltage between the input signals (IN+, IN−) which are applied to the gate electrodes of the n-channel MOS field effect transistors 13 and 14 respectively, however, provided that the voltage levels of the input signals (IN+, IN−) are higher than the threshold voltage of the n-channel MOS field effect transistors 13 and 14, and both the n-channel MOS field effect transistors 13 and 14 turn ON. If, however, the voltage levels of the input signals (IN+, IN−) are lower than the threshold voltage of the n-channel MOS field effect transistors 13 and 14, then the n-channel MOS field effect transistors 13 and 14 turn OFF, whereby the differential input n-channel transistor pair exhibits no detection operation, resulting in no operation as the sampling circuit.

Figure 6A:
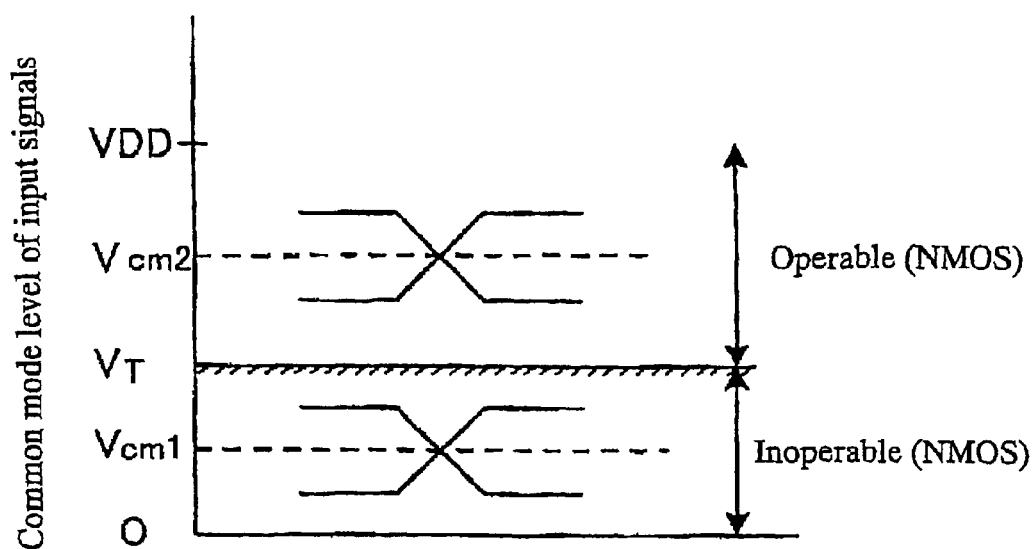
FIG. 6A is a diagram illustrative of operable and inoperable states of the differential input n-channel transistor pair in relation to the common mode level of the input signals with reference to the threshold voltage of the n-channel MOS field effect transistors.
Figure 6B:
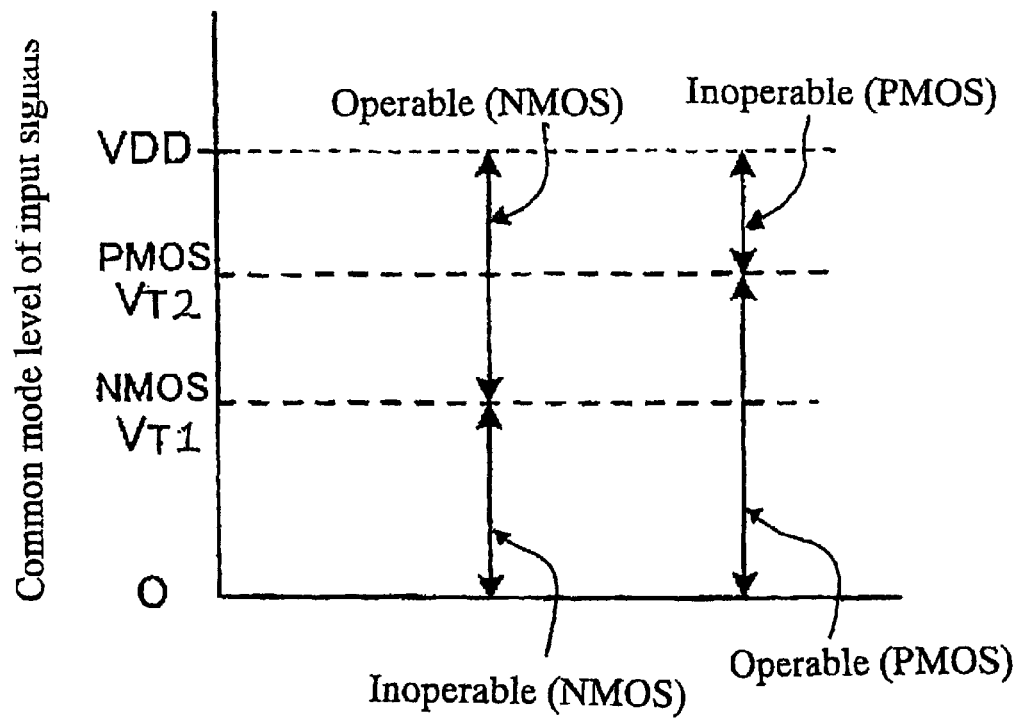
FIG. 6B is a diagram illustrative of operable and inoperable states of the differential input n-channel and p-channel transistor pairs in relation to the common mode level of the input signals with reference to the threshold voltages of the n-channel and p-channel MOS field effect transistors.

FIG. 6A is a diagram illustrative of operable and inoperable states of the differential input n-channel transistor pair in relation to the common mode level of the input signals with reference to the threshold voltage of the n-channel MOS field effect transistors. FIG. 6B is a diagram illustrative of operable and inoperable states of the differential input n-channel and p-channel transistor pairs in relation to the common mode level of the input signals with reference to the threshold voltages of the n-channel and p-channel MOS field effect transistors.

For example, as shown in FIG. 6A, if a common mode level "Vcm2" of the input signal or input data is higher than a threshold voltage "$V_T$", then the differential input n-channel transistor pair is placed in the operable state to detect the voltage difference between the input signals or the input data (IN+, IN−). If a common mode level "Vcm1" of the input signal or input data is lower than the threshold voltage "$V_T$", then the differential input n-channel transistor pair is placed in the inoperable state, whereby no signal is outputted from the differential input n-channel transistor pair.

In accordance with the present invention, however, not only the differential input n-channel transistor pair but also the differential input p-channel transistor pair are provided, so that as shown in FIG. 6B, if the common mode level "Vcm" of the input signals or input data is lower than a threshold voltage "$V_{T1}$" of the n-channel MOS field effect transistor, then the differential input p-channel transistor pair is placed in the operable state to detect the voltage difference between the input signals or the input data (IN+, IN−), even the differential input n-channel transistor pair is placed in the inoperable state. If the common mode level "Vcm" of the input signals or input data is higher than the threshold voltage "$V_{T1}$" of the n-channel MOS field effect transistor and lower than a threshold voltage "$V_{T2}$" of the p-channel MOS field effect transistor, then both the differential input n-channel and p-channel transistor pairs are placed in the operable state to detect the voltage difference between the input signals or the input data (IN+, IN−). If the common mode level "Vcm" of the input signals or input data is higher than the threshold voltage "$V_{T2}$" of the p-channel MOS field effect transistor, then the differential input n-channel transistor pair is placed in the operable state to detect the voltage difference between the input signals or the input data (IN+, IN−), even the differential input p-channel transistor pair is placed in the inoperable state. Namely, in any common mode levels, at least one of the differential input n-channel and p-channel transistor pairs is placed in the operable state to detect the voltage difference between the input signals or the input data (IN+, IN−).

Also, the above novel circuit configuration of the second embodiment of the present invention has the same effects as in the first embodiment. Namely, the output side of the bistable circuit is connected in parallel to the output side of the differential input transistor pair. This circuit configuration reduces the number of the series-connected-stages of the transistors to reduce the output impedance, thereby reducing the delay time in falling the output signal from the master latch circuit. This allows the sampling receiver to exhibit a desired high speed latch operation.

In the above circumstances, even if the clock signal frequency is high, while the delay time of latch-operation of the slave latch circuit is small, for which reason, it is possible, any cases, that the delay time in falling of the output signal from the master latch circuit is so small as to ensure that the clock signal is inverted but after the time-delayed latch operation of the slave latch circuit has been completed. In any cases, the sampling receiver is free of any undesired malfunction.

Figure 7:
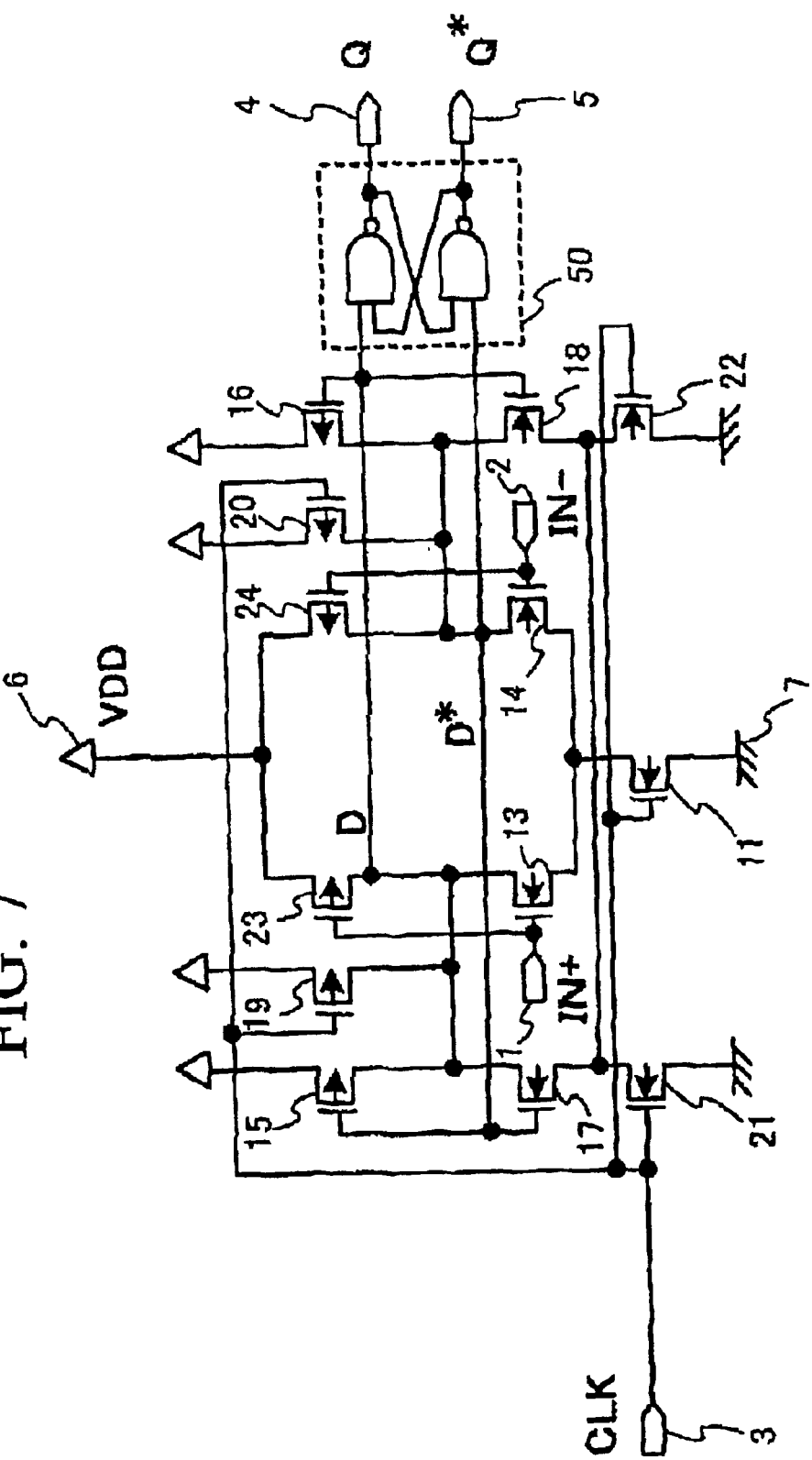
FIG. 7 is a circuit diagram illustrative of a circuit configuration of one typical novel sampling receiver in a third embodiment in accordance with the present invention.

Third Embodiment:

A third embodiment according to the present invention will be described in detail with reference to the drawings. FIG. 7 is a circuit diagram illustrative of a circuit configuration of one typical novel sampling receiver in a third embodiment in accordance with the present invention. The sampling receiver of this third embodiment has the following circuit configuration which is different from the second embodiment in the absence of the current-supplying p-channel MOS field effect transistor 25 and the series connection of the two inverters 26 and 27.

The sampling receiver includes a master latch circuit and a slave latch circuit. The slave latch circuit comprises a set-reset-flip-flop circuit 50 which has two input terminals "S" and "R" and two output terminals 4 "Q" and 5 "Q*". The input terminal "S" of the slave latch circuit receives the output "D" from the master latch circuit. The input terminal "R" of the slave latch circuit receives the output "D*" from the master latch circuit.

The master latch circuit includes the first and second differential input transistor pairs and a bistable circuit. The bistable circuit comprises two CMOS inverters.

The first differential input transistor pair further comprises two n-channel MOS field effect transistors 13 and 14 having respective gate electrodes which are connected to input terminals 1 and 2 respectively. The input terminal 1 receives an input of small amplitude data IN+, while the input terminal 2 receives another input of small amplitude data IN−. Respective source electrodes of the n-channel MOS field effect transistors 13 and 14 are commonly connected through a current supplying n-channel MOS field effect transistor 11 to a ground line 7. A gate electrode of the n-channel MOS field effect transistor 11 is connected to another input terminal 3 which receives an input of a clock signal CLK for receiving the clock signal CLK. In the sampling process, the n-channel MOS field effect transistor 11 turns ON to place the first and second differential input transistor pairs in an operable state. In the non-sampling state, the n-channel MOS field effect transistor 11 remains OFF to place the first and second differential input transistor pairs in an inoperable state. A drain electrode of the n-channel MOS field effect transistor 13 is connected to drain electrodes of p-channel and n-channel MOS field effect transistors 15 and 17 as well as connected to drain electrodes of p-channel MOS field effect transistors 19 and 23. A drain electrode of the n-channel MOS field effect transistor 14 is connected to drain electrodes of p-channel and n-channel MOS field effect transistors 16 and 18 as well as connected to drain electrodes of p-channel MOS field effect transistors 20 and 24.

The second differential input transistor pair further comprises two p-channel MOS field effect transistors 23 and 24 having respective gate electrodes which are connected to the input terminals 1 and 2 respectively. Respective source electrodes of the p-channel MOS field effect transistors 23 and 24 are commonly connected to a power voltage line 6. In the non-sampling state, the n-channel MOS field effect transistor 11 remains OFF to place the first and second differential input transistor pairs in an inoperable state. A drain electrode of the p-channel MOS field effect transistor 23 is connected to the drain electrodes of p-channel and n-channel MOS field effect transistors 15 and 17 as well as connected to the drain electrodes of the n-channel and p-channel MOS field effect transistors 13 and 19. A drain electrode of the p-channel MOS field effect transistor 24 is connected to the drain electrodes of the p-channel and n-channel MOS field effect transistors 16 and 18 as well as connected to the drain electrodes of the n-channel and p-channel MOS field effect transistors 14 and 20.

As described above, the bistable circuit comprises first and second CMOS inverters. The first CMOS inverter comprises the p-channel MOS field effect transistor 15 and the n-channel MOS field effect transistor 17. The second CMOS inverter comprises the p-channel MOS field effect transistor 16 and the n-channel MOS field effect transistor 18. The first and second CMOS inverters are cross-connected to each other to form the bistable circuit. Namely, an input side of the first CMOS inverter is connected to an output side of the second CMOS inverter, while an output side of the first CMOS inverter is connected to an input side of the second CMOS inverter. Source electrodes of the p-channel MOS field effect transistors 15 and 16 are connected to the power voltage line 6. A source electrode of the n-channel MOS field effect transistor 17 is connected through an n-channel MOS field effect transistor 21 to the ground line 7. A source electrode of the n-channel MOS field effect transistor 18 is connected through an n-channel MOS field effect transistor 22 to the ground line 7. Gate electrodes of the n-channel MOS field effect transistors 21 and 22 are commonly connected to the input terminal 3 for receiving the clock signal "CLK". The drain electrode of the p-channel MOS field effect transistor 19 is connected to the output side of the first CMOS inverter and also the drain electrodes of the n-channel and p-channel MOS field effect transistors 13 and 23 respectively included in the first and second differential input transistor pairs. A source electrode of the p-channel MOS field effect transistor 19 is connected to the power voltage line 6. The drain electrode of the p-channel MOS field effect transistor 20 is connected to the output side of the second CMOS inverter and also the drain electrodes of the n-channel and p-channel MOS field effect transistors 14 and 24 respectively included in the first and second differential input transistor pairs. A source electrode of the p-channel MOS field effect transistor 20 is connected to the power voltage line.

The master latch circuit in the sampling receiver comprises the n-channel MOS field effect transistors 11, 13, 14, 17, 18, 21 and 22, and the p-channel MOS field effect transistors 15, 16, 19, 20, 23 and 24. The master latch circuit has two outputs (D, D*) from the first and second CMOS inverters, respectively. The master latch circuit includes the first differential input transistor pair which comprises the n-channel MOS field effect transistors 13 and 14 and also the second differential input transistor pair which comprises the p-channel MOS field effect transistors 23 and 24. The master latch circuit includes the bistable circuit which further includes a pair of the first and second CMOS inverters. The first CMOS inverter comprises the first pair of the p-channel and n-channel MOS field effect transistors 15 and 17. The second CMOS inverter comprises the second pair of the p-channel and n-channel MOS field effect transistors 16 and 18.

The p-channel MOS field effect transistors 15 and 19 are connected in parallel to each other between the power voltage line 6 and the drain electrodes of the n-channel and p-channel MOS field effect transistors 13 and 23. The gate electrode of the p-channel MOS field effect transistor 19 receives the clock signal "CLK". Also, the p-channel MOS field effect transistors 16 and 20 are connected in parallel to each other between the power voltage line and the drain electrodes of the n-channel and p-channel MOS field effect transistors 14 and 24. The gate electrode of the p-channel MOS field effect transistor 20 receives the clock signal "CLK". In the release from the latch-state of the master latch circuit, the p-channel MOS field effect transistors 19 and 20 turn ON, so that both the outputs (D, D*) of the master latch circuit become the high level "H". In the latch-state of the master latch circuit, the n-channel MOS field effect transistors 21 and 22 turn ON, so as to supply a current to the bistable circuit and also to suppress any substantive through-current in the transitional process of the first and second CMOS inverters.

The first and second differential input transistor pairs are connected in parallel to each other with reference to the output side of the master latch circuit.

In the above-described circuit configuration, the three current-supplying n-channel MOS field effect transistors 11, 21 and 22 are provided. It is, however, possible as a modification that in place of the two current-supplying n-channel MOS field effect transistors 21 and 22, a single current-supplying n-channel MOS field effect transistor may be provided.

The signal latch operation of the sampling receiver shown in FIG. 5 in accordance with this third embodiment is the same as of the sampling receiver in the second embodiment and as shown in FIG. 5. The duplicate detailed descriptions will be omitted.

The second differential input transistor pair comprising the two p-channel MOS field effect transistors 23 and 24 is incapable of the differential amplification function for the small amplitude data (IN+, IN−) inputted into the input terminals 1 and 2. The second differential input transistor pair is, however, capable of the detection function for the small amplitude data (IN+, IN−) inputted into the input terminals 1 and 2. This detected voltage difference is usable for driving the bistable circuit to perform the latch operation. For this reason, as shown in FIG. 6B, if the common mode level "Vcm" of the input signals or input data is lower than a threshold voltage "$V_{T1}$" of the n-channel MOS field effect transistor, then the differential input p-channel transistor pair is placed in the operable state to detect the voltage difference between the input signals or the input data (IN+, IN−), even the differential input n-channel transistor pair is placed in the inoperable state. If the common mode level "Vcm" of the input signals or input data is higher than the threshold voltage "$V_{T1}$" of the n-channel MOS field effect transistor and lower than a threshold voltage "$V_{T2}$" of the p-channel MOS field effect transistor, then both the differential input n-channel and p-channel transistor pairs are placed in the operable state to detect the voltage difference between the input signals or the input data (IN+, IN−). If the common mode level "Vcm" of the input signals or input data is higher than the threshold voltage "$V_{T2}$" of the p-channel MOS field effect transistor, then the differential input n-channel transistor pair is placed in the operable state to detect the voltage difference between the input signals or the input data (IN+, IN−), even the differential input p-channel transistor pair is placed in the inoperable state. Namely, in any common mode levels, at least one of the differential input n-channel and p-channel transistor pairs is placed in the operable state to detect the voltage difference between the input signals or the input data (IN+, IN−).

Also, the above novel circuit configuration of the third embodiment of the present invention has the same effects as in the first embodiment. Namely, the output side of the bistable circuit is connected in parallel to the output side of the differential input transistor pair. This circuit configuration reduces the number of the series-connected-stages of the transistors to reduce the output impedance, thereby reducing the delay time in falling the output signal from the master latch circuit. This allows the sampling receiver to exhibit a desired high speed latch operation.

In the above circumstances, even if the clock signal frequency is high, while the delay time of latch-operation of the slave latch circuit is small, for which reason, it is possible, any cases, that the delay time in falling of the output signal from the master latch circuit is so small as to ensure that the clock signal is inverted but after the time-delayed latch operation of the slave latch circuit has been completed. In any cases, the sampling receiver is free of any undesired malfunction.

Figure 8:
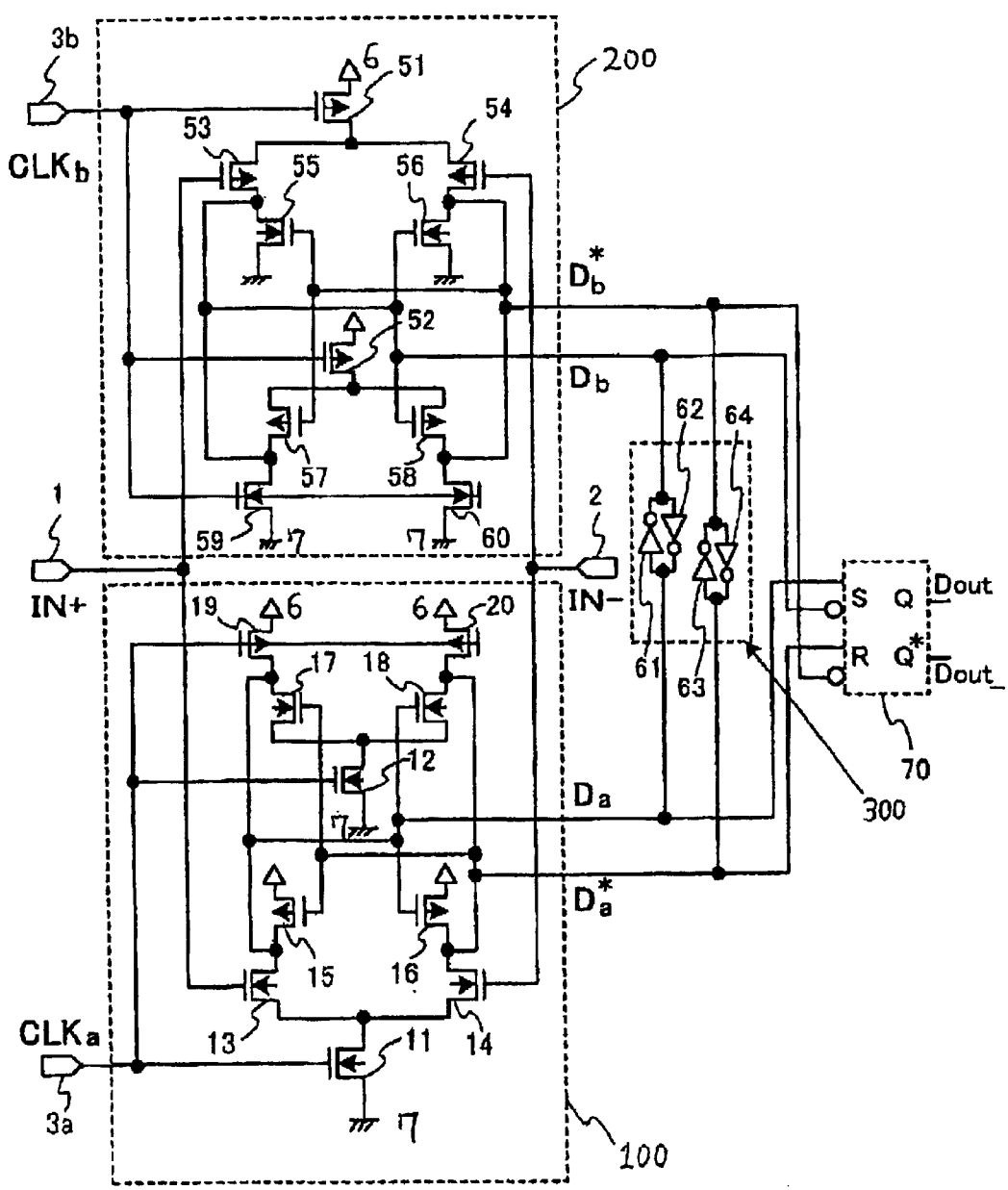
FIG. 8 is a circuit diagram illustrative of a circuit configuration of one typical novel sampling receiver in a fourth embodiment in accordance with the present invention.

Fourth Embodiment:

A fourth embodiment according to the present invention will be described in detail with reference to the drawings. FIG. 8 is a circuit diagram illustrative of a circuit configuration of one typical novel sampling receiver in a fourth embodiment in accordance with the present invention.

The sampling receiver includes first and second master latch circuits 100 and 200, a cross-coupled inverter circuit pair 300 and a slave latch circuit. The first master latch circuit 100 has two outputs "Da" and "Da*". The first master latch circuit 100 has a clock input terminal "CLKa" which receives an input of a clock signal "CLKa". The second master latch circuit 200 has two outputs "Db" and "Db*". The second master latch circuit 200 has an inversion clock input terminal "CLKb" which receives an input of an inversion clock signal "CLKb". The first and second master latch circuits 100 and 200 have first and second common data input terminals 1 and 2, wherein the first common data input terminal 1 receives the input data "IN+", while the second common data input terminal 2 receives the input data "IN−".

The slave latch circuit comprises a differential-type set-reset-flip-flop circuit 70 which has set and reset input terminals "S*" and "R" and inversion set and reset input terminals "S" and "R" as well as two output terminals "Dout" and "Dout_". The set input terminal "S*" of the slave latch circuit receives the output "Da" from the first master latch circuit 100. The inversion set input terminal "S" receives the output "Db" from the second master latch circuit 200. The reset input terminal "R" of the slave latch circuit receives the output "Da*" from the first master latch circuit 100. The inversion reset input terminal "R*" of the slave latch circuit receives the output "Db*" from the second master latch circuit 200.

The cross-coupled inverter circuit pair 300 comprises first and second cross-coupled inverter circuits. The first cross-coupled inverter circuit is connected between the output "Da" from the first master latch circuit 100 and the output "Db" from the second master latch circuit 200. The second cross-coupled inverter circuit is connected between the output "Da*" from the first master latch circuit 100 and the output "Db*" from the second master latch circuit 200. The first cross-coupled inverter circuit comprises a pair of inverters 61 and 62 which are connected in anti-parallel to each other between the output "Da" from the first master latch circuit 100 and the output "Db" from the second master latch circuit 200. The second cross-coupled inverter circuit comprises another pair of inverters 63 and 64 which are connected in anti-parallel to each other between the output "Da*" from the first master latch circuit 100 and the output "Db*" from the second master latch circuit 200.

The first master latch circuit 100 has the same circuit configuration as described in the first embodiment and shown in FIG. 3. The second master latch circuit 200 has a different circuit configuration from the first master latch circuit 100 in view that the both circuit configurations are opposite to each other with reference to between the power voltage line and the ground line, and between the n-channel MOS field effect transistor and the p-channel MOS field effect transistor. The first master latch circuit 100 includes a differential input n-channel transistor pair and a first bistable circuit. The second master latch circuit 200 includes a differential input p-channel transistor pair and a second bistable circuit.

In the first master latch circuit 100, the first bistable circuit comprises two CMOS inverters. The differential input n-channel transistor pair further comprises two n-channel MOS field effect transistors 13 and 14 having respective gate electrodes which are connected to the input terminals 1 and 2 respectively. The input terminal 1 receives an input of small amplitude data IN+, while the input terminal 2 receives another input of small amplitude data IN−. Respective source electrodes of the n-channel MOS field effect transistors 13 and 14 are commonly connected through a current supplying n-channel MOS field effect transistor 11 to a ground line 7. A gate electrode of the n-channel MOS field effect transistor 11 is connected to the clock input terminal 3a which receives an input of a clock signal "CLKa". In the sampling process, the n-channel MOS field effect transistor 11 turns ON to place the differential input n-channel transistor pair in an operable state. In the non-sampling state, the n-channel MOS field effect transistor 11 remains OFF to place the differential input n-channel transistor pair in an inoperable state. A drain electrode of the n-channel MOS field effect transistor 13 is connected to drain electrodes of p-channel and n-channel MOS field effect transistors 15 and 17 as well as connected to a drain electrode of a p-channel MOS field effect transistor 19. A drain electrode of the n-channel MOS field effect transistor 14 is connected to drain electrodes of p-channel and n-channel MOS field effect transistors 16 and 18 as well as connected to a drain electrode of a p-channel MOS field effect transistor 20.

As described above, the first bistable circuit comprises first and second CMOS inverters. The first CMOS inverter comprises the p-channel MOS field effect transistor 15 and the n-channel MOS field effect transistor 17. The second CMOS inverter comprises the p-channel MOS field effect transistor 16 and the n-channel MOS field effect transistor 18. The first and second CMOS inverters are cross-connected to each other to form the first bistable circuit. Namely, an input side of the first CMOS inverter is connected to an output side of the second CMOS inverter, while an output side of the first CMOS inverter is connected to an input side of the second CMOS inverter. Source electrodes of the p-channel MOS field effect transistors 15 and 16 are connected to a power voltage line 6. Source electrodes of the n-channel MOS field effect transistors 17 and 18 are commonly connected through an n-channel MOS field effect transistor 12 to a ground line 7. A gate electrode of the n-channel MOS field effect transistor 12 is connected to the input terminal 3a for receiving the clock signal "CLKa". The drain electrode of the p-channel MOS field effect transistor 19 is connected to the output side of the first CMOS inverter and also the drain electrode of the n-channel MOS field effect transistor 13 in the differential input n-channel transistor pair. A source electrode of the p-channel MOS field effect transistor 19 is connected to the power voltage line 6. The drain electrode of the p-channel MOS field effect transistor 20 is connected to the output side of the second CMOS inverter and also the drain electrode of the n-channel MOS field effect transistor 14 in the differential input n-channel transistor pair. A source electrode of the p-channel MOS field effect transistor 20 is connected to the power voltage line 6.

The first master latch circuit 100 in the sampling receiver comprises the n-channel MOS field effect transistors 11, 12, 13, 14, 17 and 18, and the p-channel MOS field effect transistors 15, 16, 19 and 20. The first master latch circuit 100 has two outputs (Da, Da) from the first and second CMOS inverters, respectively. The first master latch circuit 100 includes the differential input n-channel transistor pair which comprises the n-channel MOS field effect transistors 13 and 14. The first master latch circuit 100 includes the first bistable circuit which further includes a pair of the first and second CMOS inverters. The first CMOS inverter comprises the first pair of the p-channel and n-channel MOS field effect transistors 15 and 17. The second CMOS inverter comprises the second pair of the p-channel and n-channel MOS field effect transistors 16 and 18.

The p-channel MOS field effect transistors 15 and 19 are connected in parallel to each other between the power voltage line and the drain electrode of the n-channel MOS field effect transistor 13. The gate electrode of the p-channel MOS field effect transistor 19 receives the clock signal "CLKa". Also, the p-channel MOS field effect transistors 16 and 20 are connected in parallel to each other between the power voltage line 6 and the drain electrode of the n-channel MOS field effect transistor 14. The gate electrode of the p-channel MOS field effect transistor 20 receives the clock signal "CLKa". In the release from the latch-state of the first master latch circuit 100, the p-channel MOS field effect transistors 19 and 20 turn ON, so that both the outputs (Da, Da*) of the first master latch circuit 100 become the high level "H". In the latch-state of the first master latch circuit 100, the n-channel MOS field effect transistor 12 turns ON, so as to supply a current to the first bistable circuit and also to suppress any substantive through-current in the transitional process of the first and second CMOS inverters.

In the second master latch circuit 200, the second bistable circuit comprises two CMOS inverters. The differential input p-channel transistor pair further comprises two p-channel MOS field effect transistors 53 and 54 having respective gate electrodes which are connected to the input terminals 1 and 2 respectively. The input terminal 1 receives an input of small amplitude data IN+, while the input terminal 2 receives another input of small amplitude data IN−. Respective source electrodes of the p-channel MOS field effect transistors 53 and 54 are commonly connected through a current supplying p-channel MOS field effect transistor 51 to a power voltage line 6. A gate electrode of the p-channel MOS field effect transistor 51 is connected to the clock input terminal 3b which receives an input of an inversion clock signal "CLKb". In the sampling process, the p-channel MOS field effect transistor 51 turns ON to place the differential input p-channel transistor pair in an operable state. In the non-sampling state, the p-channel MOS field effect transistor 51 remains OFF to place the differential input p-channel transistor pair in an inoperable state. A drain electrode of the p-channel MOS field effect transistor 53 is connected to drain electrodes of n-channel and p-channel MOS field effect transistors 55 and 57 as well as connected to a drain electrode of an n-channel MOS field effect transistor 59. A drain electrode of the p-channel MOS field effect transistor 54 is connected to drain electrodes of n-channel and p-channel MOS field effect transistors 56 and 58 as well as connected to a drain electrode of an n-channel MOS field effect transistor 60.

As described above, the second bistable circuit comprises third and fourth CMOS inverters. The third CMOS inverter comprises the n-channel MOS field effect transistor 55 and the p-channel MOS field effect transistor 57. The fourth CMOS inverter comprises the n-channel MOS field effect transistor 56 and the p-channel MOS field effect transistor 58. The third and fourth CMOS inverters are cross-connected to each other to form the second bistable circuit. Namely, an input side of the third CMOS inverter is connected to an output side of the fourth CMOS inverter, while an output side of the third CMOS inverter is connected to an input side of the fourth CMOS inverter. Source electrodes of the n-channel MOS field effect transistors 55 and 56 are connected to a ground line 7. Source electrodes of the p-channel MOS field effect transistors 57 and 58 are commonly connected through an p-channel MOS field effect transistor 52 to a power voltage line 6. A gate electrode of the p-channel MOS field effect transistor 52 is connected to the input terminal 3b for receiving the clock signal "CLKb". The drain electrode of the n-channel MOS field effect transistor 59 is connected to the output side of the third CMOS inverter and also the drain electrode of the p-channel MOS field effect transistor 53 in the differential input p-channel transistor pair. A source electrode of the n-channel MOS field effect transistor 59 is connected to the ground line 7. The drain electrode of the n-channel MOS field effect transistor 60 is connected to the output side of the fourth CMOS inverter and also the drain electrode of the p-channel MOS field effect transistor 54 in the differential input p-channel transistor pair. A source electrode of the n-channel MOS field effect transistor 60 is connected to the ground line 7.

The second master latch circuit 200 in the sampling receiver comprises the p-channel MOS field effect transistors 51, 52, 53, 54, 57 and 58, and the n-channel MOS field effect transistors 55, 56, 59 and 60. The second master latch circuit 200 has two outputs (Db, Db*) from the third and fourth CMOS inverters, respectively. The second master latch circuit 200 includes the differential input p-channel transistor pair which comprises the p-channel MOS field effect transistors 53 and 54. The second master latch circuit 200 includes the second bistable circuit which further includes a pair of the third and fourth CMOS inverters. The third CMOS inverter comprises the first pair of the n-channel and p-channel MOS field effect transistors 55 and 57. The fourth CMOS inverter comprises the second pair of the n-channel and p-channel MOS field effect transistors 56 and 58.

The n-channel MOS field effect transistors 55 and 59 are connected in parallel to each other between the power voltage line and the drain electrode of the p-channel MOS field effect transistor 53. The gate electrode of the n-channel MOS field effect transistor 59 receives the inversion clock signal "CLKb". Also, the n-channel MOS field effect transistors 56 and 60 are connected in parallel to each other between the ground line 7 and the drain electrode of the p-channel MOS field effect transistor 54. The gate electrode of the n-channel MOS field effect transistor 60 receives the inversion clock signal "CLKb". In the release from the latch-state of the second master latch circuit 200, the n-channel MOS field effect transistors 59 and 60 turn ON, so that both the outputs (Db, Db*) of the second master latch circuit 200 become the high level "H". In the latch-state of the second master latch circuit 200, the p-channel MOS field effect transistor 52 turns ON, so as to supply a current to the second bistable circuit and also to suppress any substantive through-current in the transitional process of the third and fourth CMOS inverters.

FIG. 9 is a timing chart explaining operations of the novel sampling receiver of FIG. 8. When the clock signal "CLKa" of the low level "L" is inputted into the clock input terminal 3a, while the inversion clock signal "CLKb" of the high level "H" is inputted into the second clock input terminal 3b, the n-channel MOS field effect transistors 11 and 12 and the p-channel MOS field effect transistors 51 and 52 turn OFF, while the p-channel MOS field effect transistors 19 and 20 and the n-channel MOS field effect transistors 59 and 60 turn ON. The differential input n-channel transistor pair receives no current supply from the ground line 7 through the OFF-state n-channel MOS field effect transistor 11 as well as the differential input p-channel transistor pair receives no current supply from the power voltage line 6 through the OFF-state p-channel MOS field effect transistor 51, whereby the differential input n-channel transistor pair and the differential input p-channel transistor pair are placed into the inoperable state. The first bistable circuit also receives no current supply from the ground line 7 through the OFF-state n-channel MOS field effect transistor 12, whereby the first bistable circuit is placed into the inoperable state. The second bistable circuit also receives no current supply from the power voltage line 6 through the OFF-state p-channel MOS field effect transistor 52, whereby the second bistable circuit is placed into the inoperable state. Since the p-channel MOS field effect transistors 19 and 20 are placed in the ON-state, the two outputs (Da, Da*) from the first master latch circuit are in the high level "H". Further, since the n-channel MOS field effect transistors 59 and 60 are placed in the ON-state, the two outputs (Db, Db*) from the second master latch circuit are in the low level "L". Accordingly, the differential-type set-reset-flip-flop circuit 70 as the slave latch circuit shows no change of the outputs (Q, Q*).

In the above-described state, if the clock signal "CLKa" inputted into the input terminal 3a shows a level-transition from the low level "L" into the high level "H" while the inversion clock signal "CLKb" inputted into the input terminal 3b shows another level-transition from the high level "H" into the low level "L", then the n-channel MOS field effect transistors 11 and 12 and the p-channel MOS field effect transistors 51 and 52 turn ON, while the p-channel MOS field effect transistors 19 and 20 and the n-channel MOS field effect transistors 59 and 60 turn OFF, whereby the differential input n-channel transistor pair and the first bistable circuit of the first master latch circuit are placed in the operable state as well as the differential input p-channel transistor pair and the second bistable circuit of the second master latch circuit are also placed in the operable state, so that the first and second master latch circuits show the sampling operations for sampling the input signals. At this time, the small amplitude data (IN+) of the high level and the small amplitude data (IN−) of the low level are respectively inputted into the two input terminals 1 and 2 of the differential input n-channel transistor pair and the differential input p-channel transistor pair, whereby the n-channel MOS field effect transistor 13 shows a current increase and a drain voltage drop, while the n-channel MOS field effect transistor 14 shows a current decrease and a drain voltage rise as well as the p-channel MOS field effect transistor 54 shows a current increase and a drain voltage rise, while the p-channel MOS field effect transistor 53 shows a current decrease and a drain voltage drop.

The n-channel MOS field effect transistor 18 with the gate electrode connected to the drain electrode of the n-channel MOS field effect transistor 13 shows a transition to the OFF-state, while the p-channel MOS field effect transistor 16 with the gate electrode connected to the drain electrode of the n-channel MOS field effect transistor 13 shows another transition to the ON-state. The n-channel MOS field effect transistor 17 with the gate electrode connected to the drain electrode of the n-channel MOS field effect transistor 14 shows a transition to the ON-state, while the p-channel MOS field effect transistor 15 with the gate electrode connected to the drain electrode of the n-channel MOS field effect transistor 14 shows another transition to the OFF-state. The output (Da*) of the first master latch circuit 100 remains in the high level "H", while the output (Da) of the first master latch circuit 100 becomes low level "L". This voltage fall of the output (Da*) causes the voltage fall of the reset terminal of the differential-type set-reset-flip-flop circuit 70.

The p-channel MOS field effect transistor 57 with the gate electrode connected to the drain electrode of the p-channel MOS field effect transistor 54 shows a transition to the OFF-state, while the n-channel MOS field effect transistor 55 with the gate electrode connected to the drain electrode of the p-channel MOS field effect transistor 54 shows another transition to the ON-state. The p-channel MOS field effect transistor 58 with the gate electrode connected to the drain electrode of the p-channel MOS field effect transistor 53 shows a transition to the ON-state, while the n-channel MOS field effect transistor 56 with the gate electrode connected to the drain electrode of the p-channel MOS field effect transistor 53 shows another transition to the OFF-state. The output (Db) of the second master latch circuit 200 remains in the low level "L", while the output (Db*) of the second master latch circuit 200 becomes high level "H". This voltage rise of the output (Db*) causes the voltage rise of the inversion reset terminal of the differential-type set-reset-flip-flop circuit 70.

Accordingly, the voltage fall of the reset terminal and the voltage rise of the inversion reset terminal do reset the differential-type set-reset-flip-flop circuit 70, whereby the output "Q" is latched at the low level "L", while the output "Q*" is latched at the high level "H".

Thereafter, when the transition into the low level "L" of the clock signal "CLKa" and the other transition into the high level "H" of the inversion clock signal "CLKb" appear, then the n-channel MOS field effect transistors 11 and 12 and the p-channel MOS field effect transistors 51 and 52 turn OFF, while the p-channel MOS field effect transistors 19 and 20 and the n-channel MOS field effect transistors 59 and 60 turn ON.

The differential input n-channel transistor pair receives no current supply from the ground line 7 through the OFF-state n-channel MOS field effect transistor 11, whereby the differential input n-channel transistor pair is placed into the inoperable state. The first bistable circuit also receives no current supply from the ground line 7 through the OFF-state n-channel MOS field effect transistor 12, whereby the first bistable circuit is placed into the inoperable state. Similarly, the differential input p-channel transistor pair receives no current supply from the power voltage line 6 through the OFF-state p-channel MOS field effect transistor 51, whereby the differential input p-channel transistor pair is placed into the inoperable state. The second bistable circuit also receives no current supply from the power voltage line 6 through the OFF-state p-channel MOS field effect transistor 52, whereby the second bistable circuit is placed into the inoperable state.

Since the p-channel MOS field effect transistors 19 and 20 are placed in the ON-state, the two outputs (Da, Da*) of the first master latch circuit are placed in the high level "H". Further, since the n-channel MOS field effect transistors 59 and 60 are placed in the ON-state, the two outputs (Db, Db) of the second master latch circuit are placed in the low level "L". Accordingly, the differential-type set-reset-flip-flop circuit 70 as the slave latch circuit shows no change of the outputs (Q, Q*) or holds the latched low level "L" of the output "Q" and the latched high level "H" of the output "Q*".

If the clock signal "CLKa" inputted into the input terminal 3a shows the level-transition from the low level "L" into the high level "H" while the inversion clock signal "CLKb" inputted into the input terminal 3b shows the other level-transition from the high level "H" into the low level "L", then the n-channel MOS field effect transistors 11 and 12 and the p-channel MOS field effect transistors 51 and 52 turn ON, while the p-channel MOS field effect transistors 19 and 20 and the n-channel MOS field effect transistors 59 and 60 turn OFF, whereby the differential input n-channel transistor pair and the first bistable circuit of the first master latch circuit are placed in the operable state as well as the differential input p-channel transistor pair and the second bistable circuit of the second master latch circuit are placed in the operable state, so that the first and second master latch circuits show the sampling operations for sampling the input signals. At this time, the small amplitude data (IN+) of the low level and the small amplitude data (IN−) of the high level are respectively inputted into the two input terminals 1 and 2 of the differential input n-channel transistor pair and the differential input p-channel transistor pair, whereby the n-channel MOS field effect transistor 14 shows a current increase and a drain voltage drop, while the n-channel MOS field effect transistor 13 shows a current decrease and a drain voltage rise. Further, the p-channel MOS field effect transistor 53 shows a current increase and a drain voltage rise, while the p-channel MOS field effect transistor 54 shows a current decrease and a drain voltage fall.

The n-channel MOS field effect transistor 18 with the gate electrode connected to the drain electrode of the n-channel MOS field effect transistor 13 shows a transition to the ON-state, while the p-channel MOS field effect transistor 16 with the gate electrode connected to the drain electrode of the n-channel MOS field effect transistor 13 shows another transition to the OFF-state. The n-channel MOS field effect transistor 17 with the gate electrode connected to the drain electrode of the n-channel MOS field effect transistor 14 shows a transition to the OFF-state, while the p-channel MOS field effect transistor 15 with the gate electrode connected to the drain electrode of the n-channel MOS field effect transistor 14 shows another transition to the ON-state. The output (Da) of the first master latch circuit 100 becomes low level "L", while the output (Da*) of the first master latch circuit 100 remains in the high level "H"; thereby causing the voltage fall of the set terminal of the differential-type set-reset-flip-flop circuit 70.

The p-channel MOS field effect transistor 58 with the gate electrode connected to the drain electrode of the p-channel MOS field effect transistor 53 shows a transition to the OFF-state, while the n-channel MOS field effect transistor 56 with the gate electrode connected to the drain electrode of the p-channel MOS field effect transistor 53 shows another transition to the ON-state. The p-channel MOS field effect transistor 57 with the gate electrode connected to the drain electrode of the p-channel MOS field effect transistor 54 shows a transition to the ON-state, while the n-channel MOS field effect transistor 55 with the gate electrode connected to the drain electrode of the p-channel MOS field effect transistor 54 shows another transition to the OFF-state. The output (Db*) of the second master latch circuit 200 remains in the low level "L", while the output (Db) of the second master latch circuit 200 becomes high level "H". This voltage rise of the output (Db) causes the voltage rise of the inversion reset terminal of the differential-type set-reset-flip-flop circuit 70.

Accordingly, the voltage rise of the reset terminal and the voltage fall of the set terminal do set the differential-type set-reset-flip-flop circuit 70, whereby the output "Q" is latched at the high level "H", while the output "Q*" is latched at the low level "L".

Thereafter, when the transition into the low level "L" of the clock signal "CLKa" and the other transition into the high level "H" of the inversion clock signal "CLKb" appear, then the n-channel MOS field effect transistors 11 and 12 and the p-channel MOS field effect transistors 51 and 52 turn OFF, while the p-channel MOS field effect transistors 19 and 20 and the n-channel MOS field effect transistors 59 and 60 turn ON. The differential input n-channel transistor pair and the first bistable circuit are placed into the inoperable state as well as the differential input p-channel transistor pair and the second bistable circuit are also placed into the inoperable state. The two outputs (Da, Da*) of the first master latch circuit are placed in the high level "H", while the two outputs (Db, Db*) of the second master latch circuit are placed in the low level "L". Accordingly, the differential-type set-reset-flip-flop circuit 70 as the slave latch circuit shows no change of the outputs (Q, Q*) or holds the latched high level "H" of the output "Q" and the latched low level "L" of the output "Q*".

The present voltage levels of the small amplitude data (IN+, IN−) are converted to the CMOS levels and latched at those levels even when the transition into the high level "H" of the clock signal "CLKa" and also the other transition into the low level "L" of the inversion clock signal "CLKb" appear.

As described above, the drain electrode of the n-channel MOS field effect transistor 13 included in the differential input n-channel transistor pair is connected to the output (Da) of the first master latch circuit 100. The drain electrode of the n-channel MOS field effect transistor 17 included in the first bistable circuit is also connected to the same output (Da) of the first master latch circuit 100. Namely, the respective drain electrodes of the n-channel MOS field effect transistors 13 and 17 are in parallel to each other with reference to the output (Da) of the first master latch circuit 100. Further, the drain electrode of the n-channel MOS field effect transistor 14 included in the differential input n-channel transistor pair is connected to the output (Da*) of the first master latch circuit 100. The drain electrode of the n-channel MOS field effect transistor 18 included in the first bistable circuit is also connected to the same output (Da*) of the first master latch circuit 100. Namely, the respective drain electrodes of the n-channel MOS field effect transistors 14 and 18 are in parallel to each other with reference to the output (Da*) of the first master latch circuit 100.

Similarly, the drain electrode of the p-channel MOS field effect transistor 53 included in the differential input p-channel transistor pair is connected to the output (Db) of the second master latch circuit 200. The drain electrode of the p-channel MOS field effect transistor 57 included in the second bistable circuit is also connected to the same output (Db) of the second master latch circuit 200. Namely, the respective drain electrodes of the p-channel MOS field effect transistors 53 and 57 are in parallel to each other with reference to the output (Db) of the second master latch circuit 200. Further, the drain electrode of the p-channel MOS field effect transistor 54 included in the differential input p-channel transistor pair is connected to the output (Db*) of the second master latch circuit 200. The drain electrode of the p-channel MOS field effect transistor 58 included in the second bistable circuit 200 is also connected to the same output (Db*) of the second master latch circuit 200. Namely, the respective drain electrodes of the p-channel MOS field effect transistors 54 and 58 are in parallel to each other with reference to the output (Db*) of the second master latch circuit 200.

The externally inputted small amplitude data (IN+, IN−) are sampled upon the high level "H" of the clock signal "CLKa" and the low level "L" of the inversion clock signal "CLKb", and then level-converted to the CMOS level by the first and second master latch circuits for supplying the output signals (Da and Da*) and the output signals (Db and Db*) to the slave latch circuit 70. An output impedance of the output terminals of the first master latch circuit, on which the output signal (Da or Da*) appears, is given by the sum of source-drain impedances of either a two-stage-series-connection of the n-channel MOS field effect transistors 11 and 13 or another two-stage-series-connection of the n-channel MOS field effect transistors 11 and 14. Similarly, an output impedance of the output terminals of the second master latch circuit, on which the output signal (Db or Db*) appears, is given by the sum of source-drain impedances of either a two-stage-series-connection of the p-channel MOS field effect transistors 51 and 53 or another two-stage-series-connection of the p-channel MOS field effect transistors 51 and 54. This means that the output impedance of the output signal (Da or Da*) from the first master latch circuit 100 as well as the output signal (Db or Db*) from the second master latch circuit 200 are thus smaller than the output impedance given by the three-stage-series-connection of the above-described conventional sampling receiver shown in FIG. 1.

The relatively small output impedance of the output signal (Da or Da*) of the first master latch circuit 100 causes a relatively small time constant of the output signal from the first master latch circuit 100. Similarly, the relatively small output impedance of the output signal (Db or Db*) of the second master latch circuit 200 causes a relatively small time constant of the output signal from the second master latch circuit 200. The relatively small time constants of the output signals from the first and second master latch circuits 100 and 200 make the transistor driving ability large apparently. Namely, the relatively small time constants of the output signals from the first and second master latch circuits 100 and 200 reduce a delay time in falling the output signal from the first master latch circuit 100 and a delay time in rising the output signal from the second master latch circuit 200. The reduction in the delay time of falling and rising the output signals from the first and second master latch circuits 100 and 200 causes a reduction in delay time of latch-operation of the slave latch circuit which comprises the differential-type set-reset-flip-flop circuit 70.

According to the above novel circuit configuration of the fourth embodiment of the present invention, the output side of the first bistable circuit is connected in parallel to the output side of the differential input n-channel transistor pair. This circuit configuration reduces the number of the series-connected-stages of the transistors to reduce the output impedance, thereby reducing the delay time in falling the output signal from the first master latch circuit 100. Similarly, the output side of the second bistable circuit is connected in parallel to the output side of the differential input p-channel transistor pair. This circuit configuration reduces the number of the series-connected-stages of the transistors to reduce the output impedance, thereby reducing the delay time in falling the output signal from the second master latch circuit 200. These allow the sampling receiver to exhibit a desired high speed latch operation.

The above novel circuit configuration of the first mater latch circuit 100 has a first series connection of the n-channel MOS field effect transistor 12 and either the n-channel MOS field effect transistor 17 or 18 included in the first bistable circuit between the ground line 7 and the drain electrode of the p-channel MOS field effect transistor 19 or 20. The above novel circuit configuration of the first mater latch circuit 100 also has a second series connection of the n-channel MOS field effect transistor 11 and either the n-channel MOS field effect transistor 13 or 14 included in the differential input n-channel transistor pair. The first and second series connections are in parallel to each other, for which reason the output impedance of the first master latch circuit 100 is further reduced, thereby further reducing the delay time in falling the output signal from the first master latch circuit 100. Similarly, the above novel circuit configuration of the second mater latch circuit 200 also has a third series connection of the p-channel MOS field effect transistor 52 and either the p-channel MOS field effect transistor 57 or 58 included in the second bistable circuit between the power voltage line 6 and the drain electrode of the n-channel MOS field effect transistor 59 or 60. The above novel circuit configuration of the second mater latch circuit 200 also has a fourth series connection of the p-channel MOS field effect transistor 51 and either the p-channel MOS field effect transistor 53 or 5 included in the differential input p-channel transistor pair. The third and fourth series connections are in parallel to each other, for which reason the output impedance of the second master latch circuit 200 is further reduced, thereby further reducing the delay time in rising the output signal from the second master latch circuit 200. This further improves the high speed performance in the latch operation of the sampling receiver.

In the above circumstances, even if the clock signal frequency is high, while the delay time of latch-operation of the slave latch circuit is small, for which reason, it is possible, any cases, that the delay time in falling or rising the output signal from the first or second master latch circuit 100 or 200 is so small as to ensure that the clock signal and the inversion clock signals are inverted but after the time-delayed latch operations of the slave latch circuit has been completed. In any cases, the sampling receiver is free of any undesired malfunction.

In addition, the current-supplying n-channel MOS field effect transistors 11 and 12 turn ON in the latch-operation so as to suppress the transitional through-current to the CMOS inverters forming the first bistable circuit of the first master latch circuit 100. Similarly, the current-supplying p-channel MOS field effect transistors 51 and 52 turn ON in the latch-operation so as to suppress the transitional through-current to the CMOS inverters forming the second bistable circuit of the second master latch circuit 200. This circuit configuration reduces the power consumption of the sampling receiver.

Furthermore, as described above, the first cross-coupled inverter circuit comprises a pair of the inverters 61 and 62 which are connected in anti-parallel to each other between the output "Da" from the first master latch circuit 100 and the output "Db" from the second master latch circuit 200. The second cross-coupled inverter circuit also comprises another pair of the inverters 63 and 64 which are connected in anti-parallel to each other between the output "Da*" from the first master latch circuit 100 and the output "Db*" from the second master latch circuit 200. This circuit configuration provides a further improvement in the latch performance of the sampling receiver as well as a further enlargement in the common mode level and a further reduction in the power consumption.

Figure 10A:
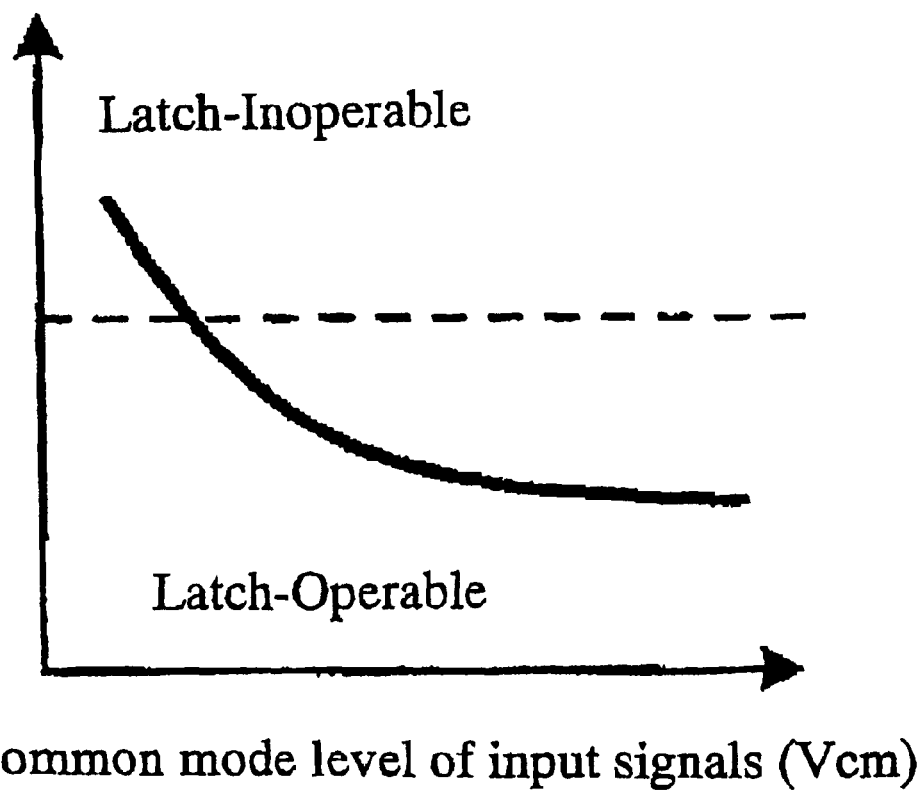
FIG. 10A is a diagram illustrative of inter-relationship between latch-operability and latch-inoperability over common mode level of input signals shown by a master latch circuit which includes only a differential input n-channel transistor pair.

FIG. 10A is a diagram illustrative of inter-relationship between latch-operability and latch-inoperability over common mode level of input signals shown by a master latch circuit which includes only a differential input n-channel transistor pair. In FIG. 10A, a horizontally extending broken line provides a boundary between the latch-operability region and the latch-inoperability region. A threshold voltage of the n-channel MOS field effect transistor is given by a crossing point between the horizontally extending broken line and a curved real line which represents the latch-operability or the latch-inoperability over the common mode level of input signals. In accordance with the master latch circuit including only the differential input n-channel transistor pair is engaged with the issue of the latch-inoperability if the common mode level of input signals is lower than the threshold voltage level.

Figure 10B:
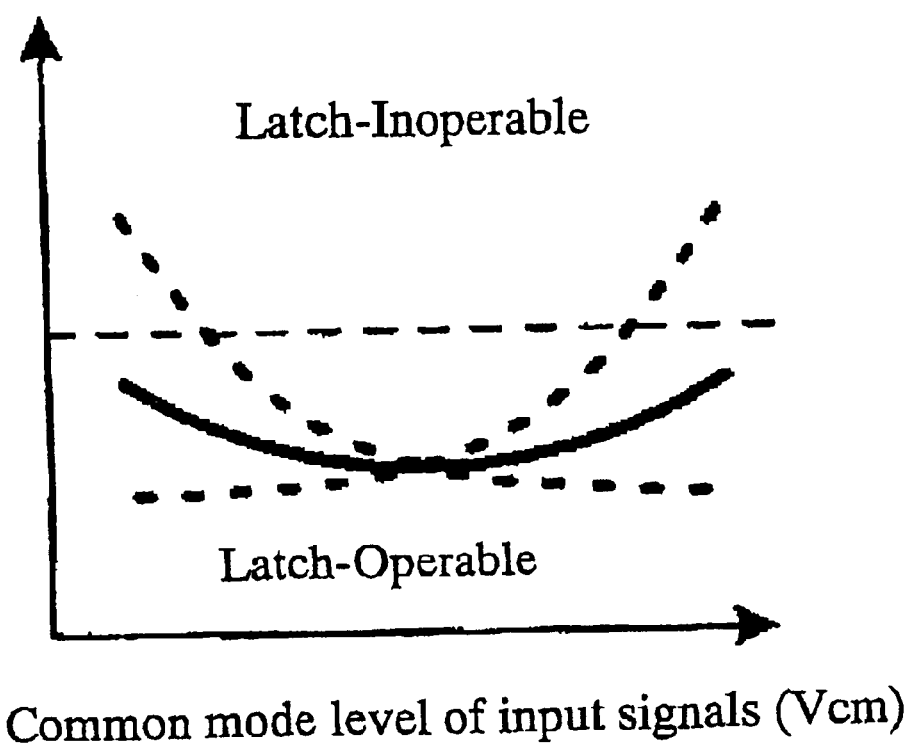
FIG. 10B is a diagram illustrative of inter-relationship between latch-operability and latch-inoperability over common mode level of input signals shown by another master latch circuit which includes both a differential input n-channel transistor pair and a differential input p-channel transistor pair.

FIG. 10B is a diagram illustrative of inter-relationship between latch-operability and latch-inoperability over common mode level of input signals shown by another master latch circuit which includes both a differential input n-channel transistor pair and a differential input p-channel transistor pair. In FIG. 10B, a horizontally extending broken line provides a boundary between the latch-operability region and the latch-inoperability region. A threshold voltage of the n-channel MOS field effect transistor is given by a crossing point between the horizontally extending broken line and curved broken lines which represent the latch-operability or the latch-inoperability over the common mode level of input signals of a master latch circuit which includes only a differential input n-channel transistor pair and another master latch circuit which includes only a differential input p-channel transistor pair.

In accordance with the master latch circuit including both the differential input n-channel transistor pair and the differential input n-channel transistor pair is always latch-operable and free from the issue of the latch-inoperability over the common mode level of input signals. If the common mode level is lower than the threshold voltage of the n-channel MOD field effect transistors, then the differential input p-channel transistor pair is operable to place the master latch circuit including the differential input p-channel transistor pair into the latch-operable state. If the common mode level is higher than the threshold voltage of the n-channel MOD field effect transistors but lower than the threshold voltage of the p-channel MOD field effect transistors, then both the differential input p-channel transistor pair and the differential input n-channel transistor pair are operable to place the master latch circuit or the master latch circuits including at least one of the differential input p-channel transistor pair and the differential input n-channel transistor pair into the latch-operable state. If the common mode level is higher than the threshold voltage of the p-channel MOD field effect transistors, then the differential input n-channel transistor pair is operable to place the master latch circuit including the differential input n-channel transistor pair into the latch-operable state. This circuit configuration enlarges the operable common mode level range of the input signals. Particularly, in case of the circuit configuration of the first and second master latch circuits connected in parallel to each other, the above-described cross-coupled inverter circuit pair 300 comprising the first and second cross-coupled inverter circuits allows the above-described complementary latch-operations of the first and second master latch circuits 100 and 200.

Figure 11A:
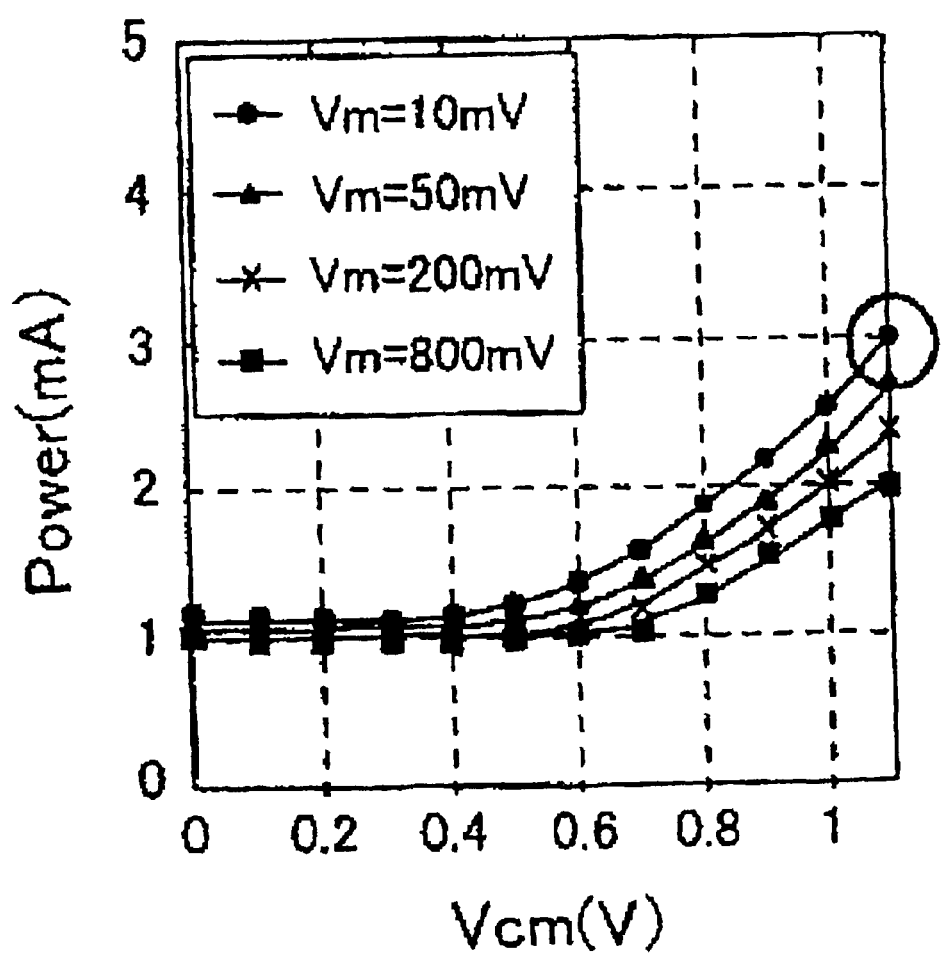
FIG. 11A is a diagram illustrative of variations in comsumption powers over common mode levels of the sampling receiver shown in FIG. 3 of the first embodiment in accordance with the present invention.
Figure 11B:
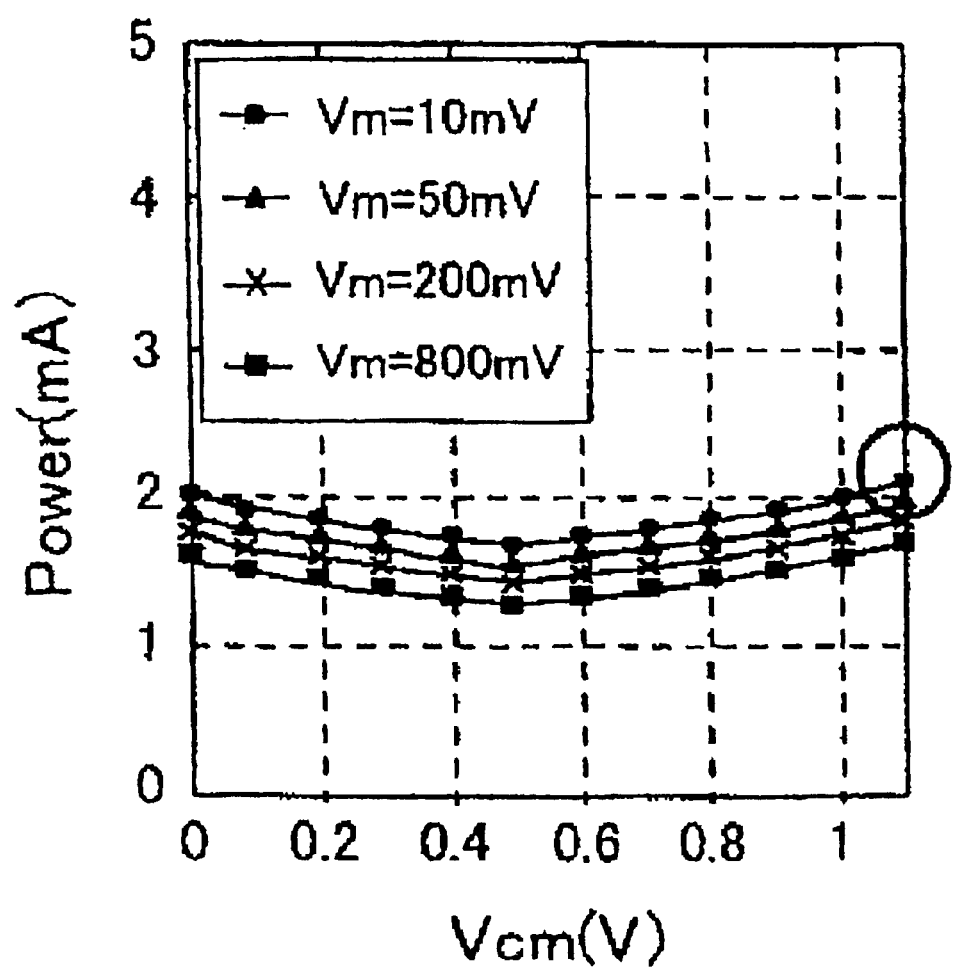
FIG. 11B is a diagram illustrative of variations in comsumption powers over common mode levels of the sampling receiver shown in FIG. 8 of the fourth embodiment in accordance with the present invention.

FIG. 11A is a diagram illustrative of variations in comsumption powers over common mode levels of the sampling receiver shown in FIG. 3 of the first embodiment in accordance with the present invention. A vertical axis represents the power in milliampere unit. FIG. 11B is a diagram illustrative of variations in comsumption powers over common mode levels of the sampling receiver shown in FIG. 8 of the fourth embodiment in accordance with the present invention. A vertical axis represents the power in milliampere unit. As compared to the sampling receiver of the first embodiment, the sampling receiver of the fourth embodiment possesses a further reduction in power consumption because the above-described cross-coupled inverter circuit pair 300 averages the driving ability to reduce the dependency of the power consumption upon the common mode level of the input signals.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A sampling receiver comprising:
   a slave latch circuit; and
   first and second master latch circuits coupled to said slave latch circuit, said first and second master latch circuits performing a voltage level conversion of input signals and supplying level converted master latch signals to said slave latch circuit,
   wherein said first master latch circuit comprises:
      a first differential input transistor pair comprising a first pair of first conductivity type channel field effect transistors each having a respective output terminal coupled to said slave latch circuit, and
      a first bistable circuit comprising first and second CMOS inverters each having a respective output terminal connected to said output terminal of a corresponding one of said first pair of first conductivity type channel field effect transistors of said first differential input transistor pair for outputting a respective one of said level-converted master latch signals,
   wherein said second master latch circuit comprises:
      a second differential input transistor pair comprising a second pair of second conductivity type, different form said first conductivity type, channel field effect transistors each having a respective output terminal coupled to said slave latch circuit; and
      a second bistable circuit comprising a pair of third and fourth CMOS inverters each having a respective output terminal connected to said output terminal of a corresponding one of said second pair of second conductivity type channel field effect transistors of said, second differential input transistor pair for outputting another respective one of said level-converted master latch signals.
   wherein said first and second differential input transistor pairs receive said input signals.

2. The sampling receiver as claimed in claim 1, further including:
   a first cross-coupled inverter circuit comprising first and second inverters coupled between said output terminal of said first CMOS inverter of said first master latch circuit and said output terminal of said third CMOS inverter of said second master latch circuit; and
   a second cross-coupled inverter circuit comprising third and fourth inverters coupled between said output terminal of said second CMOS inverter of said first master latch circuit and said output terminal of said fourth CMOS inverter of said second master latch circuit.

3. The sampling receiver as claimed in claim 2, wherein said slave latch circuit comprises a differential set/reset flip-flop circuit which includes:
   a set terminal coupled to said output terminal of said first CMOS inverter of said first master latch circuit;
   a reset terminal coupled to said output terminal of said second CMOS inverter of said first master latch circuit;
   an inversion set terminal coupled to said output terminal of said third CMOS inverter of said second master latch circuit; and
   an inversion reset terminal coupled to said output terminal of said fourth CMOS inverter of said second master latch circuit.

4. The sampling receiver as claimed in claim 1, wherein said first differential input transistor pair of said first master latch circuit receives a first drive current from a first current-supplying first conductivity type channel field effect transistor which is controlled by a first clock signal, and said second differential input transistor pair of said second master latch circuit receives a second drive current from a second current-supplying second conductivity type channel field effect transistor which is controlled by a second clock signal.

5. The sampling receiver as claimed in claim 1, wherein said first and second master latch circuits are enabled by first and second clock signals, respectively, and said first and second clock signals take different states which are inverted to each other.

6. The sampling receiver as claimed in claim 5, wherein when said first and second master latch circuits are enabled, one of said first and second master latch circuits is placed in latch-operable state over any common mode levels of input signals.

7. A sampling receiver comprising:
   first and second master latch circuits for Performing a voltage level conversion of input signals and supplying level-converted master latch signals from respective master latch circuit output terminals,
   wherein said first master latch circuit comprises:
      a first differential input transistor pair comprising a first pair of first conductivity type channel field effect transistors each having a respective output terminal coupled to a corresponding one of said master latch circuit output terminals, and
      a first bistable circuit comprising first and second CMOS inverters each having a respective output terminal connected to said output terminal of a corresponding one of said first pair of first conductivity type channel field effect transistors of said first differential input transistor pair for outputting a respective one of said level-converted master latch signals, wherein said second master latch circuit comprises:

a second differential input transistor pair comprising a second pair of second conductivity type, different form said first conductivity type, channel field effect transistors each having a respective output terminal coupled to another corresponding one of said master latch circuit output terminals; and a second bistable circuit compromising a pair of third and fourth CMOS inverters each having a respective output terminal connected to said output terminal of a corresponding one of said second pair of second conductivity type channel field effect transistors of said second differential input transistor pair for outputting another respective one of said level-converted master latch signals.

8. The latch circuit as claimed in claim 7, wherein said first differential input transistor pair of said first master latch circuit receives a first drive current from a first current-supplying first conductivity type channel field effect transistor which is controlled by a first clock signal, and said second differential input transistor pair of said second master latch circuit receives a second drive current from a second current-supplying second conductivity type channel field effect transistor which is controlled by a second clock signal.

9. The latch circuit as claimed in claim 7, wherein said first and second master latch circuits are enabled by first and second clock signals, respectively, and said first and second clock signals take different states which are inverted to each other.

10. The latch circuit as claimed in claim 9, wherein when said first and second master latch circuits are enabled, one of said first and second master latch circuits is placed in latch-operable state over any common mode levels of input signals.

* * * * *